(12) United States Patent
Oh et al.

(10) Patent No.: US 10,680,004 B2
(45) Date of Patent: Jun. 9, 2020

(54) SEMICONDUCTOR MEMORY DEVICE OF THREE-DIMENSIONAL STRUCTURE

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/041,149

(22) Filed: Jul. 20, 2018

(65) Prior Publication Data
US 2019/0237472 A1    Aug. 1, 2019

(30) Foreign Application Priority Data
Jan. 29, 2018    (KR) ........................ 10-2018-0010499

(51) Int. Cl.
*H01L 27/11551* (2017.01)
*G11C 5/06* (2006.01)
*H01L 27/11578* (2017.01)
*G11C 16/00* (2006.01)
*G11C 7/18* (2006.01)
*G11C 8/14* (2006.01)

(52) U.S. Cl.
CPC .......... *H01L 27/11551* (2013.01); *G11C 5/06* (2013.01); *G11C 16/00* (2013.01); *H01L 27/11578* (2013.01); *G11C 7/18* (2013.01); *G11C 8/14* (2013.01)

(58) Field of Classification Search
CPC ... G11C 5/06; H01L 21/8221; H01L 27/0611; H01L 27/0688; H01L 27/11514; H01L 27/11521; H01L 27/11551; H01L 27/11568; H01L 27/11578; H01L 27/11597; H01L 27/1203; H01L 27/281; H01L 27/10894
See application file for complete search history.

(56) References Cited

U.S. PATENT DOCUMENTS

| 2012/0168849 A1* | 7/2012 | Choi ................. H01L 27/11582 257/324 |
| 2018/0350829 A1* | 12/2018 | Tezuka .................. G11C 16/26 |

FOREIGN PATENT DOCUMENTS

| KR | 1020100011311 | 2/2010 |
| KR | 1020160139119 | 12/2016 |
| KR | 1020170089378 | 8/2017 |

* cited by examiner

*Primary Examiner* — Cuong B Nguyen
(74) *Attorney, Agent, or Firm* — IP & T Group LLP

(57) ABSTRACT

A semiconductor memory device comprises a memory cell array disposed on a substrate, a plurality of bit lines disposed on the a memory cell array, each bit line extending in a first direction parallel to the top surface of the substrate and divided into a first bit line section and a second bit line section, and a plurality of source line pads disposed at the same layer as the bit lines between the first bit line sections of the bit lines and the second bit line sections of the bit lines.

18 Claims, 16 Drawing Sheets

SEMICONDUCTOR MEMORY DEVICE OF THREE-DIMENSIONAL STRUCTURE

CROSS-REFERENCE TO RELATED APPLICATION

The present application claims priority to Korean Patent Application No. 10-2018-0010499 filed on Jan. 29, 2018, which is incorporated herein by reference in its entirety.

BACKGROUND

1. Technical Field

Various embodiments generally relate to a semiconductor memory device and, more particularly, to a semiconductor memory device including a memory cell array of a three-dimensional structure.

2. Related Art

In order to meet excellent performance and low cost that consumers demand, there is a need for increased integration degree of a semiconductor memory device. A two-dimensional or planar memory device is largely influenced by the level of fine pattern formation technology because its degree of integration is determined by the area occupied by a unit memory cell. Hence, although it may be possible to further increase the integration of a two-dimensional semiconductor memory device integration may be limited because of the high-cost equipment required to miniaturize the pattern.

To overcome this limitation, a three-dimensional semiconductor memory device in which unit memory cells are disposed in a three-dimensional array has been developed.

SUMMARY

In an embodiment, a semiconductor memory device may include a memory cell array disposed on a substrate, a plurality of bit lines disposed on the memory cell array, each bit line extending in a first direction parallel to the top surface of the substrate, and divided into a first bit line section and a second bit line section, and a plurality of source line pads disposed at the same layer as the bit lines between the first bit line sections of the bit lines and the second bit line sections of the bit lines.

In an embodiment, a semiconductor memory device may include a peripheral circuit unit and a cell unit disposed on the peripheral circuit unit. A peripheral circuit unit may include a first substrate, a peripheral circuit element disposed on the first substrate, and a bottom insulating layer which covers the peripheral circuit element on the first substrate. The cell unit may include a second substrate disposed on the bottom insulating layer, a memory cell array disposed on the second substrate, a plurality of bit lines disposed on the a memory cell array and extended in a first direction parallel to the top surface of the substrate, each divided into a first bit line section and a second bit line section, and source line pads disposed at the same layer as the bit lines between the first bit line sections of the bit lines and the second bit line sections of the bit lines, and connected to the substrate through first contacts passing through the memory cell array.

In an embodiment, a semiconductor memory device may include a substrate having a main region and a peripheral region disposed adjacent to the main region in a second direction intersecting with a first direction, a memory cell array disposed on the main region of the substrate, pass transistors disposed on the peripheral region of the substrate, a plurality of bit lines disposed on the memory cell array and extended in a first direction, each divided into a first bit line section and a second bit line section, and source line pads disposed at the same layer as the bit lines between the first bit line sections of the bit lines and the second bit line sections of the bit lines, and connected to the substrate through first contacts passing through the memory cell array.

In an embodiment, a semiconductor memory device may include a memory cell array disposed on a substrate, a plurality of bit lines disposed on the memory cell array, each bit line extending in a first direction parallel to the top surface of the substrate, wherein a plurality of cut areas are formed spaced apart at a regular interval, each cut is formed with at least two adjacent bit lines and each bit line cut into a first bit line section and a second bit line section, and a plurality of source line pads disposed in respective cut areas at the same layer as the bit lines between the first bit line sections and the second bit line sections of the cut bit lines.

These and other features and advantages of the invention will become apparent to those with ordinary skill in the art to which the invention belongs from the following description in conjunction with the accompanying drawings.

DETAILED DESCRIPTION

Figure 1:
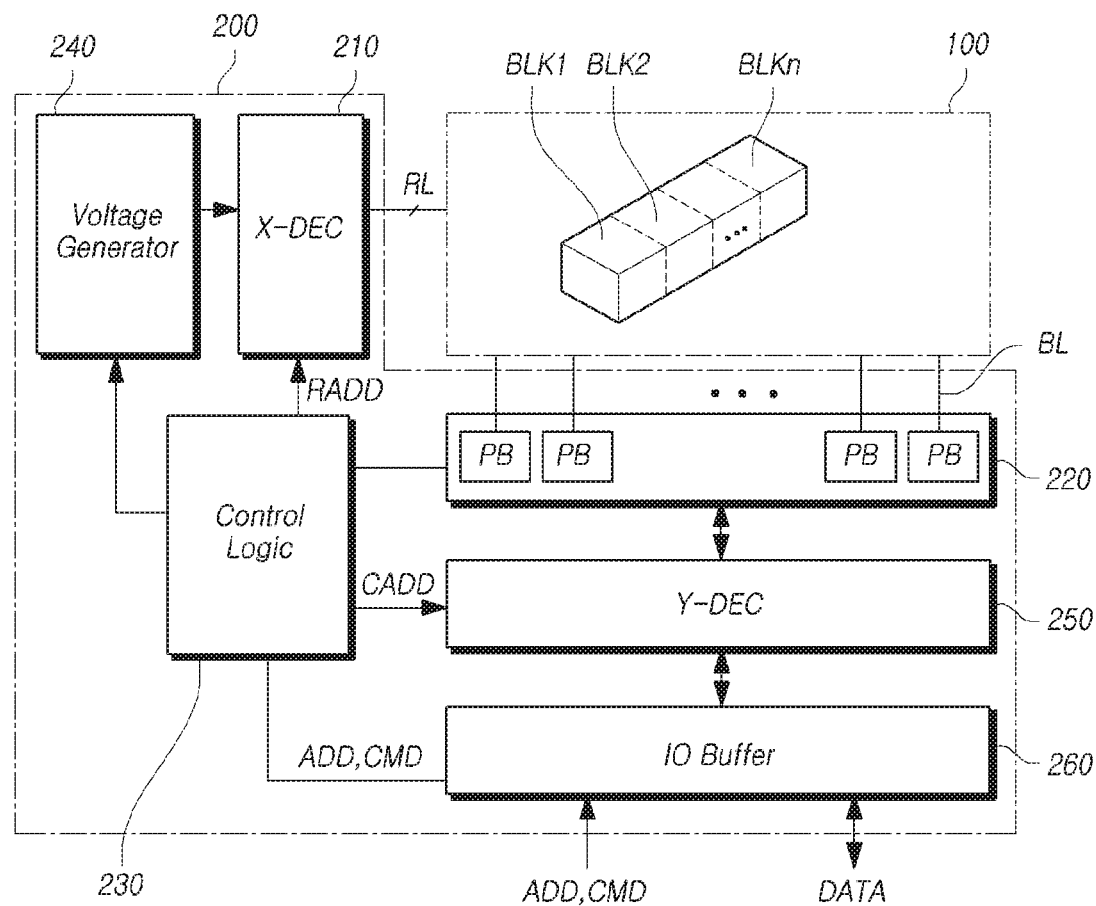
FIG. 1 is a block diagram illustrating an example of a memory device in accordance with an embodiment.

Hereinafter, a semiconductor memory device of a three-dimensional structure will be described below with reference to the accompanying drawings through various examples of embodiments. In the following embodiments described with reference to the drawings, substantially identical elements will be given the same names and the same reference numerals, and duplicate descriptions of the same elements will be omitted.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes" and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated. FIG. 1 is a block diagram illustrating an example of a memory device in accordance with an embodiment.

Referring to FIG. 1, the memory device in accordance with the embodiment may include a memory cell array 100 and a peripheral circuit 200. The peripheral circuit 200 may include a row decoder 210, a page buffer circuit 220, a control logic 230, a voltage generator 240, a column decoder 250, and an input/output buffer 260.

The memory cell array 100 may include a plurality of memory blocks BLK1 to BLKn. Each of the memory blocks BLK1 to BLKn may include a plurality of cell strings. Each of the cell strings may include a plurality of memory cells, which are stacked on a substrate. The memory cells may be nonvolatile memory cells.

The memory cell array 100 may be coupled to the row decoder 210 through row lines RL. The row lines RL may include one or more drain select lines, a plurality of word lines and one or more source select lnes. The memory cell array 100 may be coupled to the page buffer circuit 220 through a plurality of bit lines BL. The row lines RL may be coupled to the respective memory blocks BLK1 to BLKn. The bit lines BL may be coupled in common to the plurality of memory blocks BLK1 to BLKn.

The row decoder 210 may select any one of the memory blocks BLK to BLKn of the memory cell array 100 in response to a row address RADD received from the control logic 230. The row decoder 210 may transfer operating voltages such as program voltages Vpgm, pass voltages Vpass and read voltages Vread from the voltage generator 240, to the row lines RL coupled to a selected memory block. In order to transfer the operating voltages to the row lines RL, the row decoder 210 may include pass transistor circuits. Each of the pass transistor circuits may include a plurality of pass transistors.

The page buffer circuit 220 may include a plurality of page buffers PB, which are coupled to the memory cell array 100 through the bit lines BL. The page buffers PB may operate as write drivers or sense amplifiers depending on an operation mode of the memory device. In a program operation, the plurality of page buffers PB may latch data DATA received through the input/output buffer 260 and the column decoder 250, and apply voltages necessary for storing the data DATA in selected memory cells coupled to the bit lines BL, in response to a control signal from the control logic 230. In a read operation, the plurality of page buffers PB may read out data DATA stored in selected memory cells through the bit lines BL and output the read-out data DATA through the column decoder 250 and the input/output buffer 260. In an erase operation, the plurality of page buffers PB may float the bit lines BL.

The control logic 230 may output the row address RADD of an address ADD received through the input/output buffer 260 to the row decoder 210, and may output a column address CADD of the address ADD to the column decoder 250. The control logic 230 may control the page buffer circuit 220 and the voltage generator 240 for accessing selected memory cells, in response to a command CMD received through the input/output buffer 260.

The voltage generator 240 may generate various voltages required in the semiconductor memory device. For example, the voltage generator 240 may generate the program voltages Vpgm, the pass voltages Vpass, the read voltages Vread such as the selected read voltages, and the unselected read voltages.

The column decoder 250 may input program data to the page buffer circuit 220 in response to the column address CADD from the control logic 230.

Figure 2:
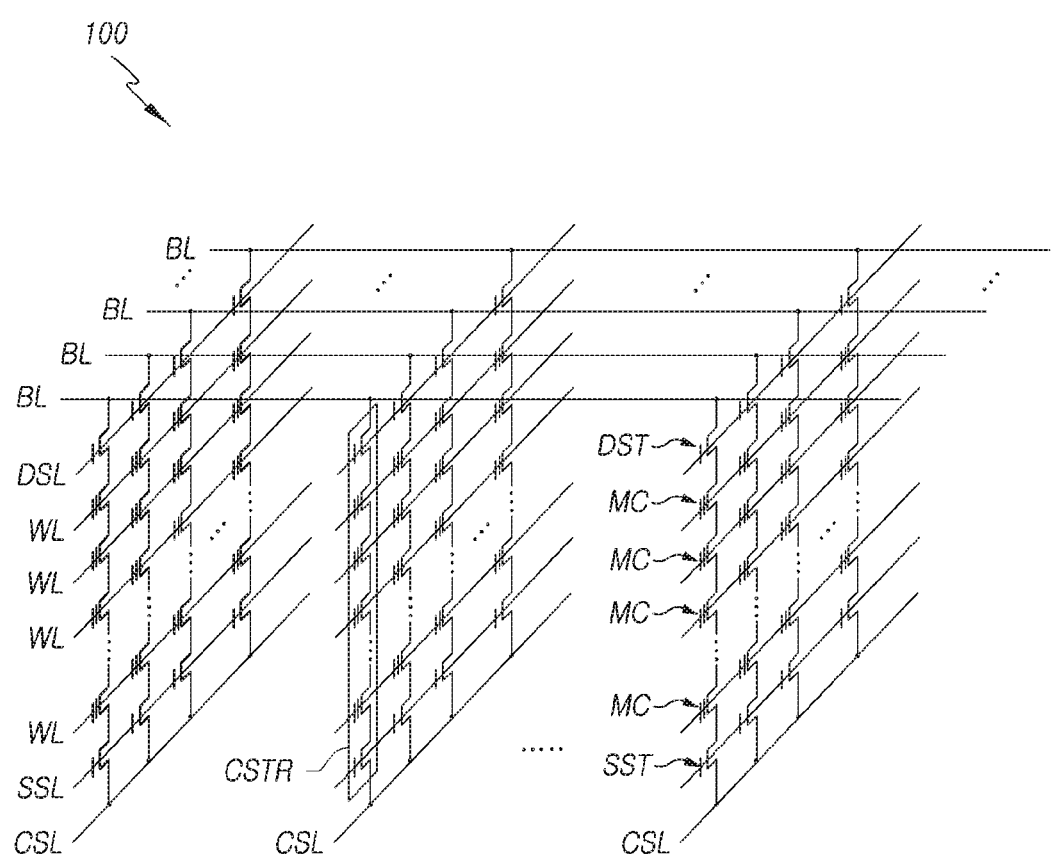
FIG. 2 is a circuit diagram illustrating an example of the memory cell array shown in FIG. 1.

FIG. 2 is an equivalent circuit diagram illustrating an example of the memory cell array shown in FIG. 1.

Referring to FIG. 2, the memory cell array 100 may include a plurality of cell strings CSTR. The cell strings CSTR are coupled between a plurality of bit lines BL and a plurality of common source lines CSL.

Each of the cell strings CSTR may include a drain select transistor DST, a plurality of memory cells MC and a source select transistor SST which are coupled in series between a corresponding bit line BL and a corresponding common source line CSL.

Source select lines SSL, a plurality of word lines WL and drain select lines DSL may be provided between the common source lines CSL and the bit lines BL. The gate terminals of the drain select transistor DST may be coupled to a corresponding drain select lines DSL, respectively. The gate terminals of the memory cells MC may be coupled to corresponding word lines WL, respectively. The gate terminals of the source select transistor SST may be coupled to a corresponding source select lines SSL, respectively.

The drain terminal of the drain select transistor DST may be coupled to a corresponding bit line BL. The source terminal of the drain select transistor DST may be coupled to the drain terminal of an uppermost memory cell MC. The drain terminal of the source select transistor SST may be coupled to a lowermost memory cell MC. The source terminal of the source select transistor SST may be coupled to a corresponding common source line CSL.

When a signal is applied to the gate terminal of the drain select transistor DST through the drain select line DSL, a signal applied through the bit line BL is transferred to the memory cells MC which are coupled in series, by which a data read or write operation may be performed. When a signal is applied to the gate terminal of the source select transistor SST through the source select line SSL, an erase operation of removing all the data stored in the memory cells MC may be performed.

While FIG. 2 illustrates a structure in which one drain select transistor DST and one source select transistor SST are included in each cell string CSTR, it is to be noted that the embodiment is not limited thereto and each cell string CSTR may include a plurality of drain select transistors DST or/and a plurality of source select transistors SST.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. The first direction FD may correspond to the extending direction of bit lines, and the second direction SD may correspond to the extending direction of the row lines. The first direction FD and the second direction SD may intersect substantially perpendicular to each other. In the drawings, a direction indicated by an arrow and a direction opposite thereto represent the same direction.

Figure 3:
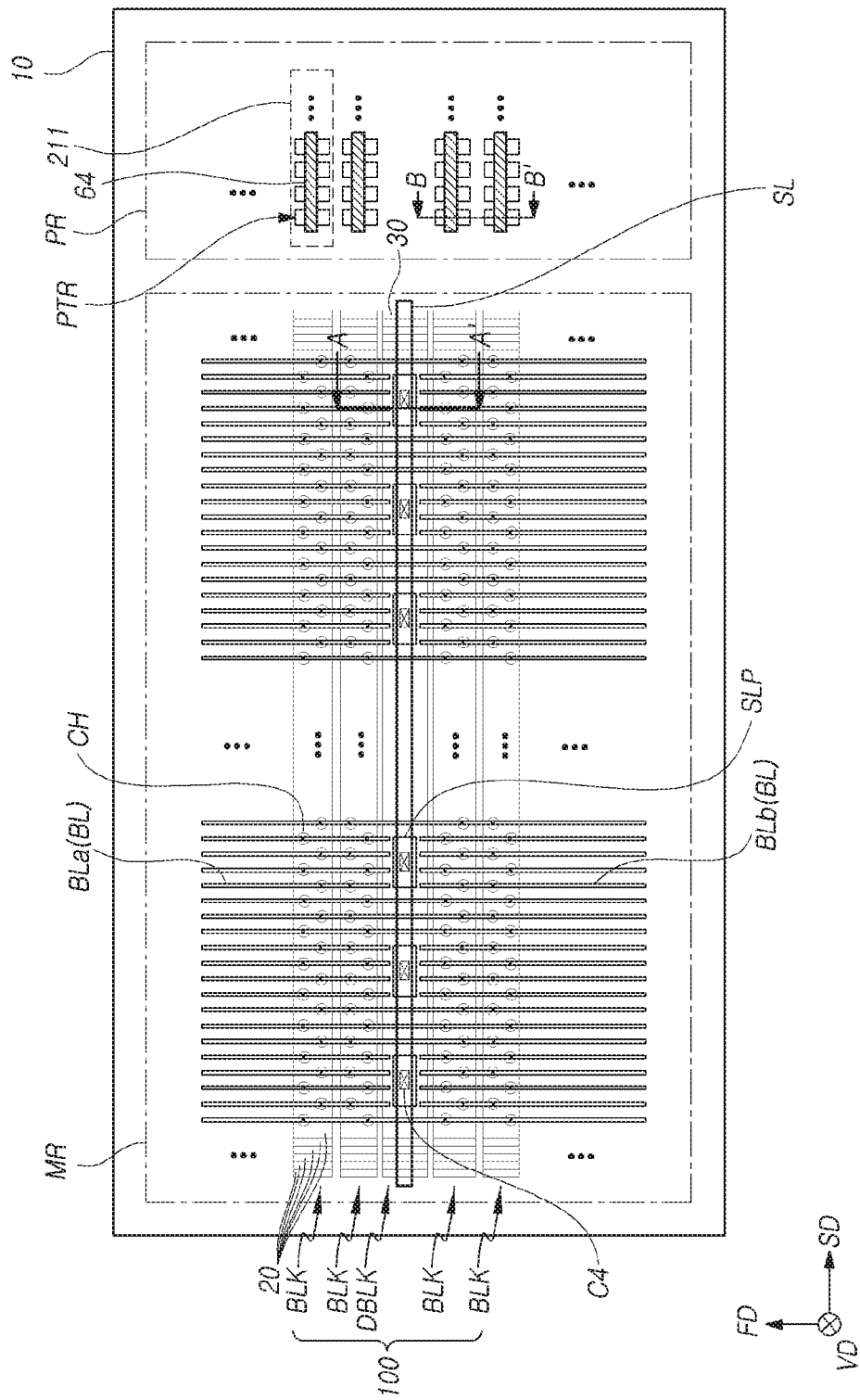
FIG. 3 is a top view illustrating an example of a semiconductor memory device in accordance with an embodiment.
Figure 4:
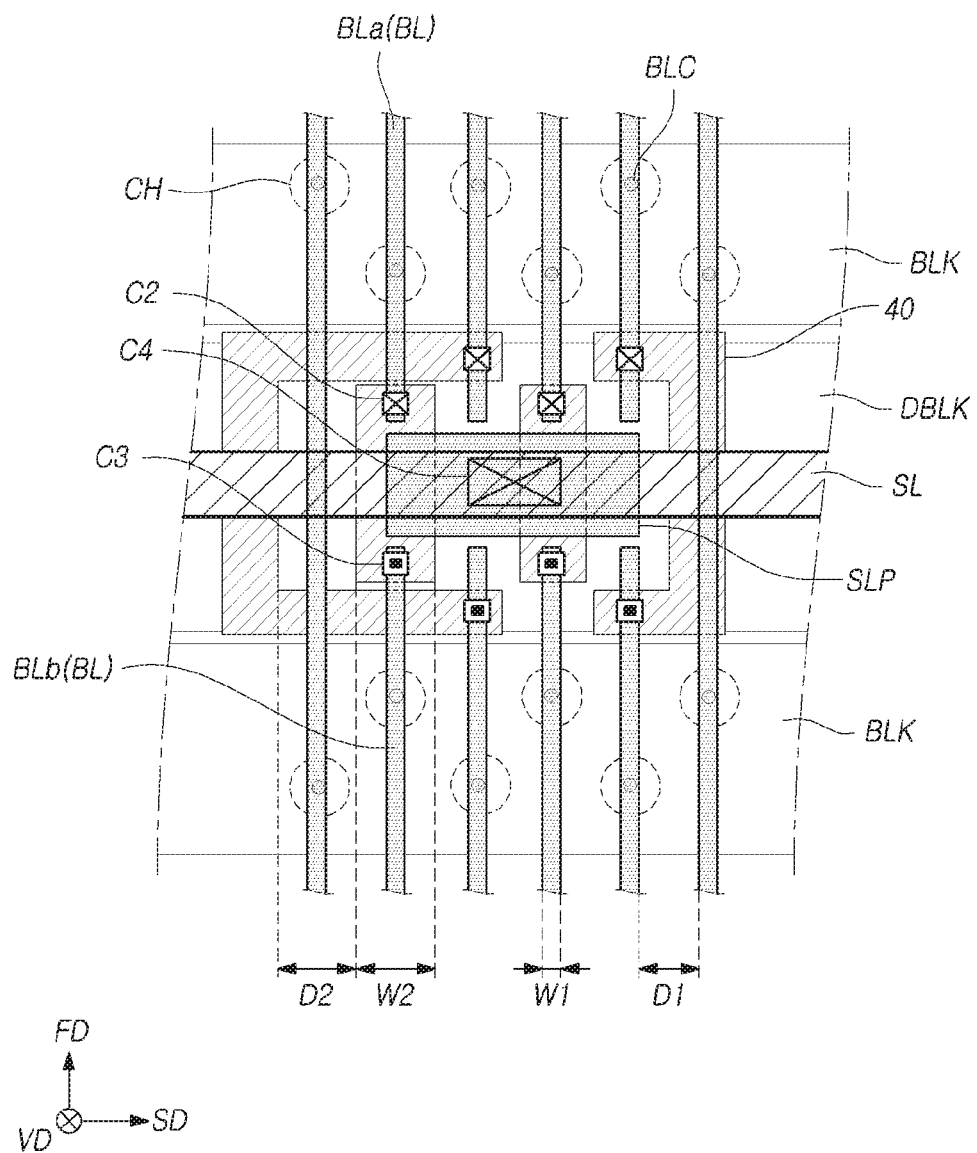
FIG. 4 is a top view illustrating an enlarged cutting portion of a bit line in FIG. 3.

FIG. 3 is a top view illustrating an example of a semiconductor memory device in accordance with an embodiment. FIG. 4 is a top view enlarging cutting portions of a bit lines in FIG. 3. In FIG. 3, connecting lines 40 in FIG. 4 and contacts C2 and C3 in FIG. 4 connected thereto are omitted for the sake of simplification of the drawings.

Referring to FIG. 3, a substrate 10 including a main region MR and a peripheral region PR is provided. The peripheral region PR may be disposed adjacent to one side edge of the main region MR in the second direction SD. Although not shown, the peripheral region PR may be disposed adjacent to both side edges of the main region MR in the second direction SD.

The memory cell array 100 may be disposed in the main region MR of the substrate 10. Peripheral circuit elements may be disposed in the peripheral region PR. The peripheral circuit elements may include pass transistor circuits 211 of the row decoder 210 in FIG. 1.

The memory cell array 100 may include a plurality of memory blocks BLK and one or more dummy blocks DBLK. The memory blocks BLK may be disposed along the first direction FD. The dummy block DBLK may be disposed between two adjacent memory blocks BLK in the first direction FD.

The dummy block DBLK may be disposed in the center portion of the main region MR in the first direction FD. While the embodiment mentioned above describes the case where one dummy block DBLK is disposed in the center portion of the main region MR, it is to be noted that the embodiment is not limited thereto and that the number and positioning of the dummy blocks may vary by design choice.

For example, in a variation of the embodiment, the dummy block DBLK may be disposed in the edge of the main area MR, or a plurality of dummy blocks may be provided along the first direction FD in the main area MR.

Each of the memory blocks BLK may include a plurality of channel structures CH and a plurality of gate electrode layers 20. The channel structures CH may extend in the vertical direction VD from the top surface of the substrate 10. The gate electrode layers 20 may be stacked along the vertical direction VD on the substrate 10 to be positioned adjacent to the channel structures CH. Each of the gate electrodes 20 may extend in the first and second directions FD and SD.

The channel structures CH may be disposed apart from each other in the first direction FD and the second direction SD. The number and the arrangement of the channel structures CH may be changed variously. For example, as shown in FIG. 3, the channel structures CH may be disposed in a zigzag pattern along the first and second directions FD and SD. The arrangement of the channel structures CH of two adjacent memory blocks BLK may be symmetrical as shown in FIG. 3, but the embodiment is not limited thereto.

The gate electrode layers 20 of each of the memory blocks BLK may extend in the second direction SD. The gate electrode layers 20 of each of the memory blocks BLK may extend in different lengths from each other along the second direction SD to form stepped portions at both ends of the gate electrode layers 20.

The dummy block DBLK may include a plurality of dummy gate electrode layers 30 which are stacked along the vertical direction VD. The dummy gate electrode layers 30 may extend in the second direction SD. The dummy gate electrode layers 30 may extend in different lengths from each other along the second direction SD to form stepped portions at both ends of the gate electrode layers 20. The number of the dummy gate electrode layers 30 which are included in the dummy block DBLK may be substantially the same as the number of the dummy gate electrode layers 30 which are included in each of the memory blocks BLK.

The pass transistor circuits 211 may correspond to the memory blocks BLK, respectively. Each of the pass transistor circuits 211 may include a plurality of pass transistors PTR. The number of the pass transistors PTR which are included in each of the pass transistor circuits 211 may be substantially the same to the number of the gate electrode layers 20 of the corresponding memory block BLK. Each pass transistor PTR is connected to a respective gate electrode layer 20 of the memory block BLK for transferring the operating voltage from the voltage generator (see 240 of FIG. 1) to the gate electrode layers 20 of the corresponding memory block BLK. The pass transistors PTR which are included in each of the pass transistor circuits 211 may be disposed along the second direction SD, and share the gate electrode 64 extending in the second direction SD.

As the semiconductor memory device becomes larger in capacity and more highly integrated, the number of the stacked gate electrode layers 20 is increased, and, therefore, the number of the pass transistors PTR included in each of the pass transistor circuits 211 is also increased to match the number of the stacked gate electrode layers 20. If the number of the pass transistors PTR included in each of the pass transistor circuits 211 is increased, the length of the peripheral region PR in the second direction SD is increased because of the area by the pass transistors PTR. In this case, the length of the semiconductor memory device in the second direction SD may be greater than the packageable size. Therefore, within the restrictions of a maximum packageable size, in order to increase the capacity and the integration of the semiconductor memory device, it may be necessary to reduce the length of the second direction SD of the semiconductor memory device.

Various embodiments of the invention are described herein that can reduce the length of the semiconductor memory device in the second direction SD, thereby contributing to a larger capacity and higher integration of the semiconductor memory device.

Referring to FIGS. 3 and 4, bit lines BL may be disposed on the memory blocks BLK and the dummy block DBLK. The bit lines BL may extend in the first direction FD and be disposed along the second direction TD. The bit lines BL may be spaced apart at a regular space interval along the second direction. The bit lines BL may be connected to the channel structures CH through the bit line contacts BLC extending in the vertical direction VD. All channel structures CH disposed in a single line along the first direction FD may connect in common to a single bit line BL. All bit lines BL may have substantially the same width. All bit lines BL may be separated from one another by substantially the same distance. For instance each of the bit lines BL may have a first width W1. Two adjacent bit lines BL may be separated by a first separation distance D1. A first pitch is defined herein as the sum of the first width W1 and the first separation distance D1.

One or more of the bit lines may be a cut bit line, i.e., a bit line physically divided into two bit line sections. While the embodiment describes the case where only some of the bit lines may be cut bit lines, it is to be noted that the embodiment is not limited thereto. For example, in a variation of the described embodiment all bit lines BL may be cut bit lines.

Each of the cut bit lines BL may include a first bit line section BLa and a second bit line section BLb extending in opposite directions along the first direction FD when viewed from the cutting portion. The cutting portion may overlap with the dummy block DBLK in the vertical direction VD. One end of the first bit line section BLa of each bit line BL may overlap with one end of the dummy block DBLK in the vertical direction VD, and one end of the second bit line section BLb may overlap with the other end of the dummy block DBLK in the vertical direction VD. The first bit line section BLa and the second bit line section BLb of single bit line BL may extend in the opposite directions along the first direction FD when viewed from the dummy block DBLK.

Source line pads SLP may be disposed in a space in which the bit lines BL are cut between the first bit line sections BLa and the second bit line sections BLb. Two or more adjacent bit lines BL may be continuously cut along the second direction SD thus creating the space for the source line pads. Each of the source line pads SLP may be disposed in the space between the first bit line sections BLa and the second bit line sections BLb of the continuously cut bit lines BL.

The source line pads SLP may overlap with the dummy block DBLK in the vertical direction VD. The source line pads SLP may be disposed along the second direction SD which is the extending direction of the dummy block DBLK.

The width of each of the source line pads SLP in the second direction SD may be greater than the width of each of the bit lines BL. In one embodiment, when each bit line BL has a first width W1 and the spacing between adjacent bit lines BL has a first spacing distance D1, the width of each of the source line pads SLP in the second direction SD can be defined as a sum of four times the first width W1 and three times the first spacing distance D1. In the described embodiment of FIG. 4 four consecutive bit lines are cut to create the space for the source line pads, however, the embodiment is not limited thereto.

A source line SL may be disposed on the bit lines BL and the source line pads SLP. The source line SL may extend in the second direction SD and may overlap with the source line pads SLP in the vertical direction VD.

Fourth contacts C4 may be disposed in overlapping portions between the source line SL and the source line pads SLP. The fourth contacts C4 may extend in the vertical direction VD between the source line pads SLP and the source line SL, and may electrically connect the source line SL and the source line pads SLP.

Connecting lines 40 corresponding to the cut bit lines BL may be provided under the bit lines BL. One end of each of the connecting lines 40 may overlap with the first bit line section BLa of the corresponding bit line BL in the vertical direction VD, and the other end may overlap with the second bit line section BLb of the corresponding bit line BL in the vertical direction VD.

The width of each of the connecting lines 40 in the second direction SD may be greater than the width of each of the bit lines BL in the second direction SD. The interval between adjacent connecting lines 40 in the second direction SD may be greater than the interval between adjacent bit lines BL in the second direction SD. For example, if the width of each of the bit lines BL in the second direction SD is the first width W1 and the interval between the adjacent bit lines BL in the second direction SD is the first distance D1, the width of each of the connecting lines 40 in the second direction SD may have a second width W2 greater than the first width W1, and the interval between adjacent connecting lines 40 in the second direction SD may have a second separation distance D2 greater than the first separation distance D1. In this case, the pitch of the connecting lines 40 may be larger than the pitch of the bit lines BL. The pitch of the connecting lines may preferably be from about 200% to about 1600% greater than the pitch of the bit lines. The connection lines may have a thickness proportional to the pitch thereof. Thus, the connection lines may have a reduced resistance as the pitch increases. The connection lines 40 may extend substantially in the first direction FD. Some of the connection lines 40 may have a shape in which both ends of the first direction FD are bents (elbows), some others may have a line shape. For example, the bents may be 90 degree bents. Stated otherwise, some of the connection lines 40 may have a U-shape rotated by 90 degrees. Because some of the connection lines 40 may have a U-shape rotated by 90 degrees, the connection lines 40 having a larger pitch than the bit lines BL can be disposed overlapping with the first and the second bit line sections BLa, BLb in the vertical direction VD. We note, however, that the shape of the connection lines 40 as shown in FIG. 4 is just an example, and the shape of the connection pad may not be limited to the above-described shape.

Second contacts C2 may be disposed in overlapping portions between the connecting lines 40 and the first bit line sections BLa, respectively. The second contacts C2 may extend in the vertical direction VD between the connecting lines 40 and the first bit line sections BLa, and electrically connect the connecting lines 40 and the first bit line sections Bla, respectively. Third contacts C3 may be disposed in overlapping portions between the connecting lines 40 and the second bit line sections BLb, respectively. The third contacts C3 may extend in the vertical direction VD between the connecting lines 40 and the second bit line sections BLb and electrically connect the connecting lines 40 and the second bit line sections BLb, respectively.

Hereinbelow, the configuration of the semiconductor memory device in accordance with the embodiment of the invention will be described in more detail with reference to FIG. 5.

Figure 5:
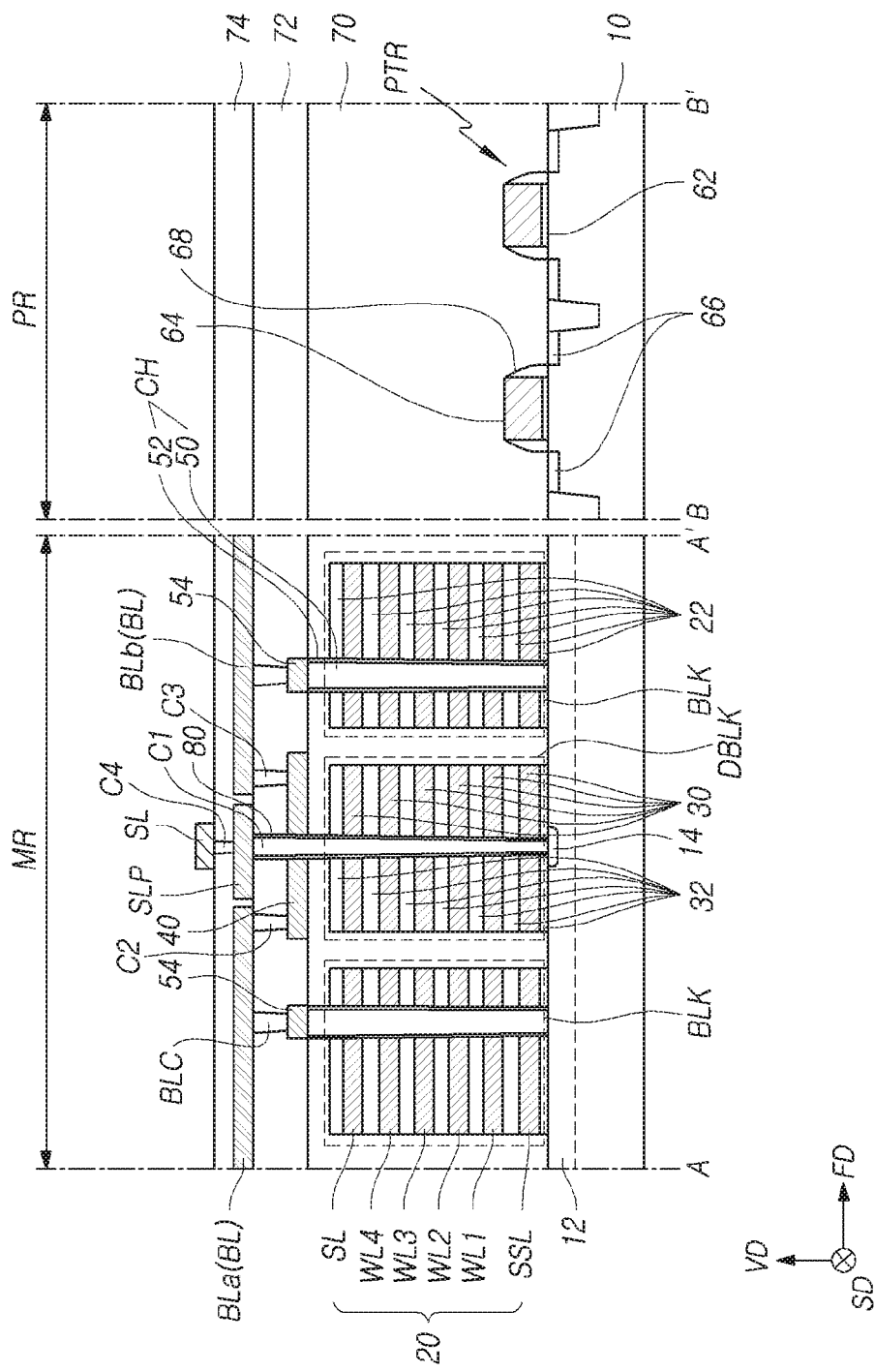
FIG. 5 is a cross-sectional view taken along the lines A-A' and B-B' of FIG. 3.

FIG. 5 is a cross-sectional view taken along the lines A-A' and B-B' of FIG. 3.

Referring to FIGS. 3 to 5, the memory blocks BLK and the dummy block DBLK may be disposed in the main region MR of the substrate 10, and the pass transistors PTR may be disposed in the peripheral region PR of the substrate 10.

The substrate 10 may be made of any suitable material including at least one selected from the group including a monocrystalline silicon layer, an SOI (silicon on insulator), a silicon layer formed on a silicon germanium (SiGe) layer, a monocrystalline silicon layer formed on an insulating layer and a polysilicon layer formed on an insulating layer.

A well region 12 may be provided in the main region MR of the substrate 10. The well region 12 may be a P-type well doped with a P-type impurity. The well region 12 may be an N-type well. The well region 12 may be realized as a P-type well and an N-type well overlapping in the vertical direction VD.

Each of the memory blocks BLK may include the plurality of channel structures CH extending in the first direction FD from the top surface of the substrate 10, the plurality of gate electrode layers 20, and a plurality of first interlayer insulating layers 22. The plurality of gate electrode layers 20, and the plurality of first interlayer insulating layers 22 are alternately stacked on the substrate 10. The first interlayer insulating layers 22 may be made of any suitable material. For example, the first interlayer insulating layers 22 may be made or include a silicon oxide layer.

Each of the channel structures CH may include a channel layer 50 and a gate insulating layer 52 which is disposed between the channel layer 50 and the gate electrode layers 20. The channel layer 50 may be made of any suitable material including a polysilicon or monocrystalline silicon, and may also include in some regions thereof an impurity such as a P-type impurity, for example, boron (B). The channel layer 50 may have the shape of a pillar. The channel layer 50 may have the shape of a solid cylinder which is completely filled up to its center. While not shown, the channel layer 50 may have the shape of a tube having an open center region. A buried insulating layer may be formed in the open center region of the channel layer.

The gate insulating layer 50 may have the shape of a straw or a cylinder shell which surrounds the outer wall of the channel layer 50. While not shown, the gate insulating layer 50 may include a tunnel insulating layer, a charge storage layer and a blocking layer sequentially stacked from the outer wall of the channel layer 50. The tunnel insulating layer may be made of or include a silicon oxide, a hafnium oxide, an aluminum oxide, a zirconium oxide or a tantalum oxide. The charge storage layer may be made of or include a silicon nitride, a boron nitride, a silicon boron nitride or a polysilicon doped with an impurity. The blocking layer may be made of or include a single layer or a stack layer of a silicon oxide, a silicon nitride, a hafnium oxide, an aluminum oxide, a zirconium oxide and a tantalum oxide. In some embodiments, the gate insulating layer 50 may have an ONO (oxide-nitride-oxide) stack structure in which an oxide layer, a nitride layer and an oxide layer are sequentially stacked.

Among the gate electrode layers 20, at least one layer from the lowermost gate electrode layer 20 may be used as a source select line SSL, and at least one layer from the uppermost gate electrode layer 20 may be used as a drain select line DSL. The gate electrode layers 20 between the source select line SSL and the drain select line DSL may form the word lines WL1~WL4. Source select transistors may be formed where the source select line SSL surrounds the channel structures CH, memory cells may be formed where the word lines WL1~WL4 surround the channel structures CH, and drain select transistors may be formed where the drain select line DSL surrounds the channel structures CH. By the above-described structure, the plurality of cell strings each including a source select transistor, memory cells and a drain select transistor which are disposed along each of the channel structures CH may be configured.

In the embodiment shown in FIG. 5, four word lines WL1 to WL4 are shown as being stacked. However, the number of the word lines is not limited thereto. For example, 8, 16, 32 or 64-word lines may be stacked along the vertical direction VD. In the embodiment shown in FIG. 5, each of the source select line SSL and the drain select line DSL is disposed in one layer in the vertical direction VD. However, the source select line (SSL) and/or the drain select line (DSL) may be disposed in two or more layers in the vertical direction VD.

The dummy block DBLK may include the plurality of dummy gate electrode layers 30 and the plurality of second interlayer insulating layers 32 which are alternately stacked along the vertical direction FD. The number of the dummy gate electrode layers 32 which are included in the dummy block DBLK may be substantially the same as the number of the gate electrode layers 20 which are included in each of the memory blocks BLK. The dummy gate electrode layers 30 may be disposed at the same layers as the gate electrode layers 20, respectively. The gate electrode layer 20 and the dummy gate electrode layer 30 which are positioned at the same layer may be formed at the same processing step. The thicknesses and materials of the gate electrode layer 20 and the dummy gate electrode layer 30 positioned at the same layer may be the same.

The number of the second interlayer insulating layers 32 which are included in the dummy block DBLK may be substantially the same as the number of the first interlayer insulating layers 22 which are included in each of the memory blocks BLK. The second interlayer insulating layers 32 may be disposed at the same layers as the first interlayer insulating layers 22, respectively. The first interlayer insulating layer 22 and the second interlayer insulating layer 32 which are positioned at the same layer may be generated at the same processing step. The heights and materials of a first interlayer insulating layer 22 and second interlayer insulating layer 32 positioned at the same layer may be the same.

Each of the pass transistors PTR may include a gate structure including a gate insulating layer 62 stacked on the substrate 10 and a gate electrode 64 stacked on the gate insulating layer 62, a source and drain region 66 disposed on the substrate 10 at both sides of the gate structure, and a gate spacer 68 disposed at both side surfaces of the gate structure.

A first insulating layer 70 may be disposed on the substrate 10 to cover the side surfaces and top surfaces of the memory blocks BLK, the dummy block DBLK and the pass transistors PTR. The first insulating layer 70 may be made of or include an insulating material, such as a silicon oxide.

Conductive pads 54 may be disposed on the channel structures CH, respectively. The conductive pads 54 may electrically connect to the channel layers 50 of the channel structures CH, respectively. The conductive pads 36 may be made of or include a silicon material which is doped with an impurity. For example, the conductive pads 36 may be made of or include N-type silicon.

A second insulating layer 72 may be disposed on the first insulating layer 70 and may cover the side surfaces and top surface of the conductive pads 54. The second insulating layer 72 may be made of or include an insulating material, such as a silicon oxide.

The bit lines BL may be disposed on the second insulating layer 72. Bit line contacts BLC which are connected to the conductive pads 54 through the second insulating layer 72 may be disposed under the bit lines BL. The bit lines BL may electrically connect to the channel layers 50 of the channel structures CH through the bit line contacts BLC and the conductive pads 54.

The bit lines may be cut in the predetermined area. In the embodiment, the bit lines may be cut above the dummy block DBLK. Each of the cut bit lines BL may include the first bit line section BLa and the second bit line section BLb extending in opposite directions along the first direction FD when viewed from the dummy block DBLK. One end of the first bit line section BLa may overlap with one end of the dummy block DBLK in the vertical direction VD, and one end of the second bit line section BLb may overlap with the other end of the dummy block DBLK in the vertical direction VD.

The first bit line section BLa and the second bit line section BLb included in the single bit line BL may extend along the first direction FD in the opposite directions when viewed from the dummy block DBLK.

The source line pads SLP may be disposed on the second insulating layer 72 between the first bit line sections BLa and the second bit line sections BLb of the bit lines BL. The source line pads SLP may be disposed at the same layer as the bit lines BL in the space provided with the cutting of the bit lines BL.

The connecting lines 40 corresponding to the cut bit lines BL may be disposed on the first insulating layer 70. One end of each of the connecting lines 40 may overlap with the first bit line section BLa of the corresponding bit line BL in the vertical direction VD, and the other end may overlap with the second bit line section BLb of the corresponding bit line BL in the vertical direction VD. The side surfaces and top surfaces of the connecting lines 40 may be covered by the second insulating layer 72.

The second contacts C2 may be disposed in overlapping portions between the connecting lines 40 and the first bit line sections BLa, respectively. The second contacts C2 may pass through the second insulating layer 72, and electrically connect the connecting lines 40 and the first bit line sections BLa. The third contacts C3 may be disposed in overlapping portions between the connecting lines 40 and the second bit line sections BLb, respectively. The third contacts C3 may pass through the second insulating layer 72, and electrically connect the connecting lines 40 and the second bit line sections BLb. That is, the first bit line section BLa and the second bit line section BLb of each of the cut bit lines BL may electrically connect through the second contact C2, the connecting line 40 and the third contact C3.

Each of the source line pads SLP may electrically connect to the substrate 10 through a first contact C1. The first contact C1 may pass through the second insulating layer 72, the connecting lines 40, the first insulating layer 70 and the dummy block DBLK in the vertical diction VD, and electrically connect between the source line pads SLP and the substrate 10. A first sidewall insulating layer 80 may be disposed at an outer wall of the first contacts C1. The first sidewall insulating layer 80 may have the shape of a straw or a cylinder shell which surrounds the outer wall of each of the first contacts C1. The first contacts C1 may be electrically isolated from the connecting lines 40 and the dummy gate electrode layers 30 of the dummy block DBLK by the first sidewall insulating layer 80. While not shown, the first contacts C1 may be disposed between the connecting lines 40. In this case, the first contacts C1 may not pass through the connecting lines 40.

A common source region 14 may be formed under the first contact C1 in the well region 12 of the substrate 10. When the well region 12 is a region doped with a p-type impurity, the common source region 14 may be an impurity region doped with a high doped n-type impurity. Conversely, when the well region 12 is a region doped with an n-type impurity, the common source region 14 may be an impurity region doped with a high doped p-type impurity. The well region 12 and the common source region 14 may form a p-n junction.

A third insulating layer 74 may be disposed on the second insulating layer 72 and cover the side surfaces and top surface of the bit lines BL and the source line pad SLP. The source line SL may be disposed on the third insulating layer 74. The source line SL may overlap with the source line pads SLP in the vertical direction VD. The source line SL may electrically connect to the source line pads SLP through the fourth contacts C4 passing through the third insulating layer 74. The source line SL may connect to the common source region 14 of the substrate 10 through the fourth contacts C4, the source line pads SLP and the first contacts C1 and may transfer the source voltage to the common source region 14.

Figure 6:
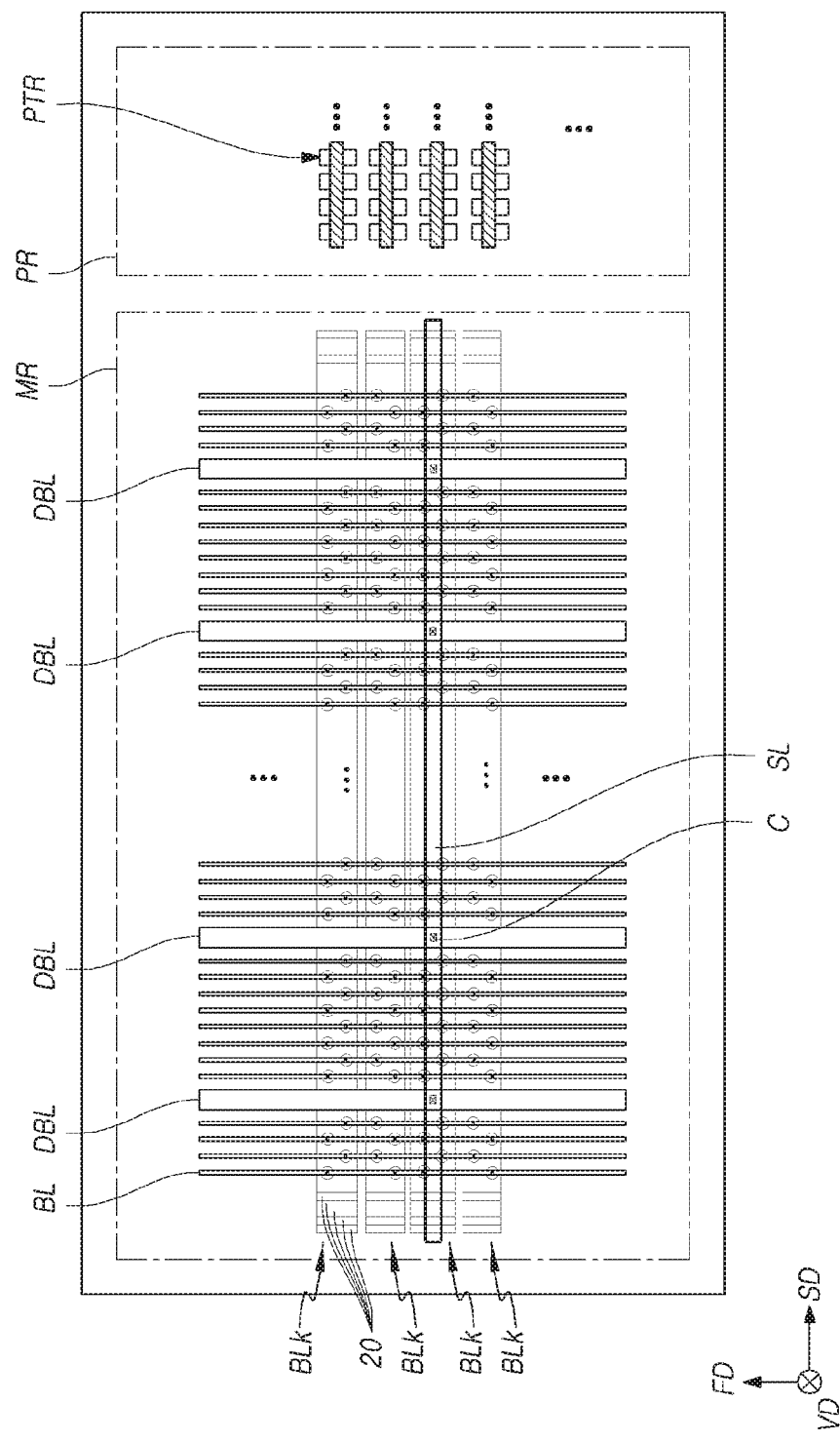
FIG. 6 is a top view illustrating an example of a semiconductor memory device in accordance with the embodiment.

FIG. 6 is a top view illustrating an example of a semiconductor memory device in accordance with the embodiment.

Referring to FIG. 6, In order to construct an electrical path connection between the source line SL on the bit lines BL and the common source region of the substrate 10, a dummy bit line DBL which is not related to the storage of valid data is disposed in the same layer as the bit lines BL, and a contact C connecting the source line SL and the dummy bit line DBL and a contact (not shown) connecting the dummy bit line DBL and the common source region of the substrate 10 can be disposed.

As the size of electronic components is reduced, the size of the required semiconductor package is decreasing. In order to make it possible to manufacture the package with a small size, it is necessary to fabricate the semiconductor memory device with a size smaller than a certain specification. When the dummy bit line DBL is added to the main region MR, the length of the main region MR in the second direction SD is increased, so that the length of the peripheral region PR in the second direction SD should be reduced accordingly. However, when the length of the peripheral region PR in the second direction SD is reduced, the number of the pass transistors PTR that can be disposed in the peripheral region PR is reduced. When the number of the pass transistors PTR is reduced, the number of stacked gate electrode layers 20 of the memory blocks BLK must be reduced, which makes it difficult to increase the capacity and integration of the semiconductor memory device.

In order to stably supply the source voltage to the substrate 10, the number of source transfer paths must be increased, and thus, the number of dummy bit lines DBL must be increased. However, if the number of the dummy bit lines DBL is increased, the length of the main region MR in the second direction SD is increased and the length of the peripheral region PR in the second direction SD is reduced accordingly. As the length of the peripheral region PR in the second direction SD is reduced, so does the number of pass transistors PTR that can be arranged in the peripheral region PR is reduced, which makes it difficult to increase the capacity and integration of the semiconductor memory device.

In accordance with the embodiments of the invention, the bit is line is cut and the source line pad is disposed in the space provided by the cut bit line and the source transfer path may be configured for connecting the source line on the bit lines and the substrate under the bit lines through the source line pad. Therefore, since it is not necessary to form the dummy bit line in order to configure the source transfer path, the size of the main region MR in the second direction SD can be reduced, and the size of the peripheral area PR in the second direction SD can be increased accordingly. Therefore, it is possible to arrange more pass transistors in the peripheral region PR and increase the number of stacked gate electrode layers of the memory blocks, so that the degree of integration of the memory device can be improved.

In addition, since the number of the source transfer paths can be increased without increasing the area, the number of the source transfer paths can be sufficiently secured, and the electrical characteristics of the semiconductor memory device can be improved.

Figure 7:
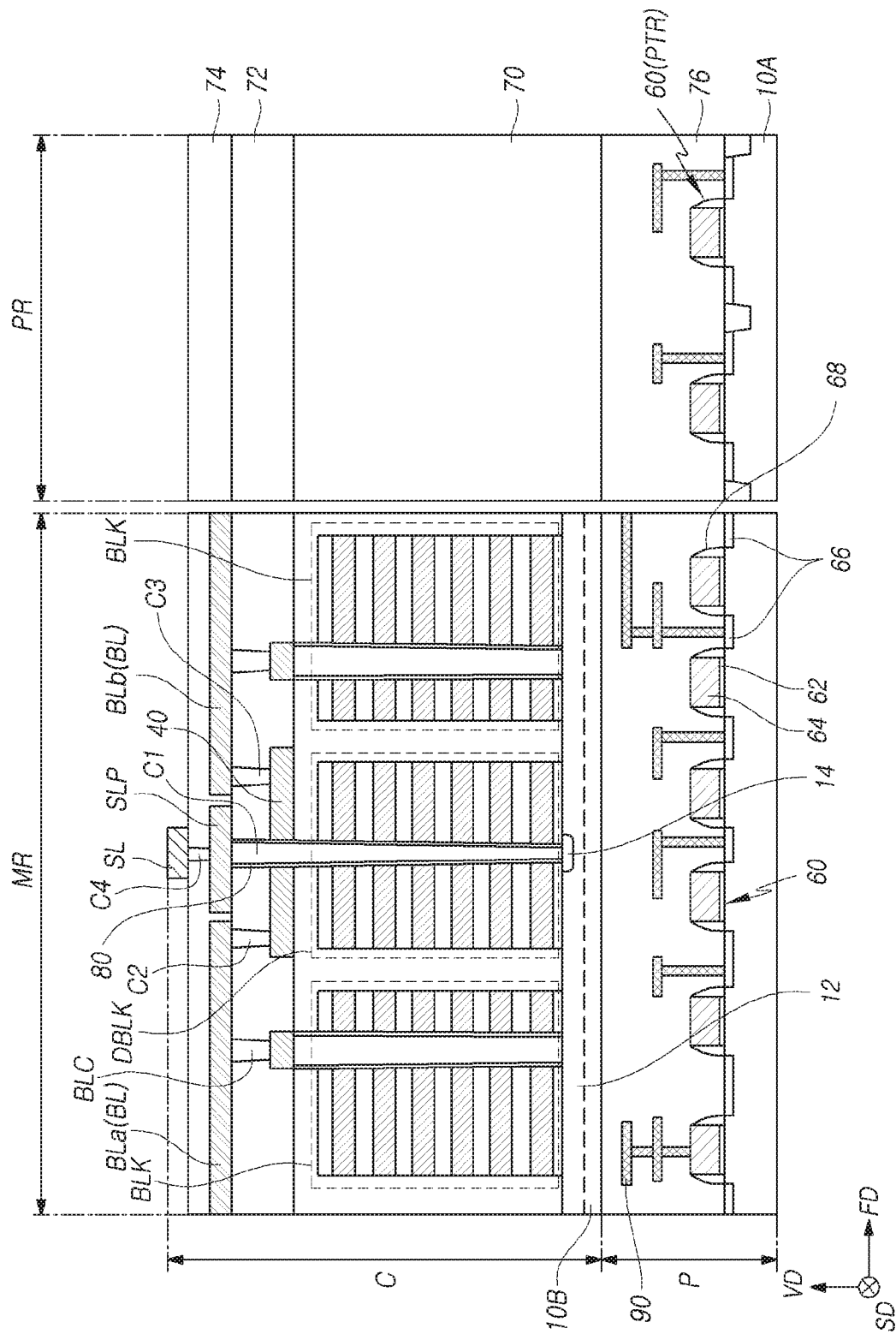
FIG. 7 is a cross-sectional view illustrating an example of a semiconductor memory device in accordance with an embodiment.

FIG. 7 is a cross-sectional view illustrating an example of a semiconductor memory device in accordance with an embodiment.

Referring to FIG. 7, the semiconductor memory device may have a PUC (peri under cell) structure. A cell unit C which includes the memory blocks BLK and the dummy block DBLK is disposed on a peripheral circuit unit P which includes the peripheral circuit elements 60.

The peripheral circuit unit P may include a first substrate 10A and the cell unit C may include a second substrate 10B. The first substrate 10A may be comprised of monocrystalline silicon. The second substrate 10A may be comprised of polycrystalline silicon. Unlike the first substrate 10A in which a monocrystalline silicon substrate can be used, the second substrate 10B may be comprised of polycrystalline silicon that is formed on an low insulating layer 76 of the peripheral circuit unit P.

A main region MR and a peripheral region PR may be defined in the semiconductor memory device or the first substrate 10A. The second substrate 10B may be disposed on the main region MR.

The peripheral circuit unit P may include the first substrate 10A, the peripheral circuit elements 60, the low insulating layer 76 and a low line 90. The peripheral circuit elements 60 may construct the peripheral circuit 200 of FIG. 1.

The pass transistors PTR of the row decoder (see 210 of FIG. 1) among the peripheral circuit (see 200 of FIG. 1) may be disposed on the peripheral region PR of the first substrate 10A.

The peripheral circuit elements 60 may include a planar transistor. If the peripheral circuit elements 60 include a planar transistor, they may include a gate structure including a gate insulating layer 62 and a gate electrode 64 stacked on the first substrate 10A, a source/drain region 66 disposed on the first substrate 10A at both sides of the gate structure, and a gate spacer 68 disposed at both side surfaces of the gate structure.

The lower insulating layer 76 may be disposed on the first substrate 10A, and may cover the peripheral circuit elements 60. The lower insulating layer 76 may be made of or comprised of an insulating material, such as silicon oxide.

The lower line 90 may be disposed in the lower insulating layer 76 and may electrically connect to one or more peripheral circuit elements 60.

The cell unit C may be disposed on the lower insulating layer 76. The cell unit C may include the second substrate 10B, the memory blocks BLK, the dummy block DBLK, the connecting lines 40, the bit lines BL, the source line pads SLP, the source line SL and the first to the third insulating layers 70, 72 and 74.

The second substrate 10B may be disposed on a top surface of the lower insulating layer 76 of the main region MR. The well region 12 may be provided in the second substrate 103. The common source region 14 may be formed in the well region 12 of the second substrate 10B.

The remaining components included in the cell unit C except for the second substrate 10B are substantially the same as those described with reference to FIG. 5, so repeated description of the same components will be omitted.

Figure 8:
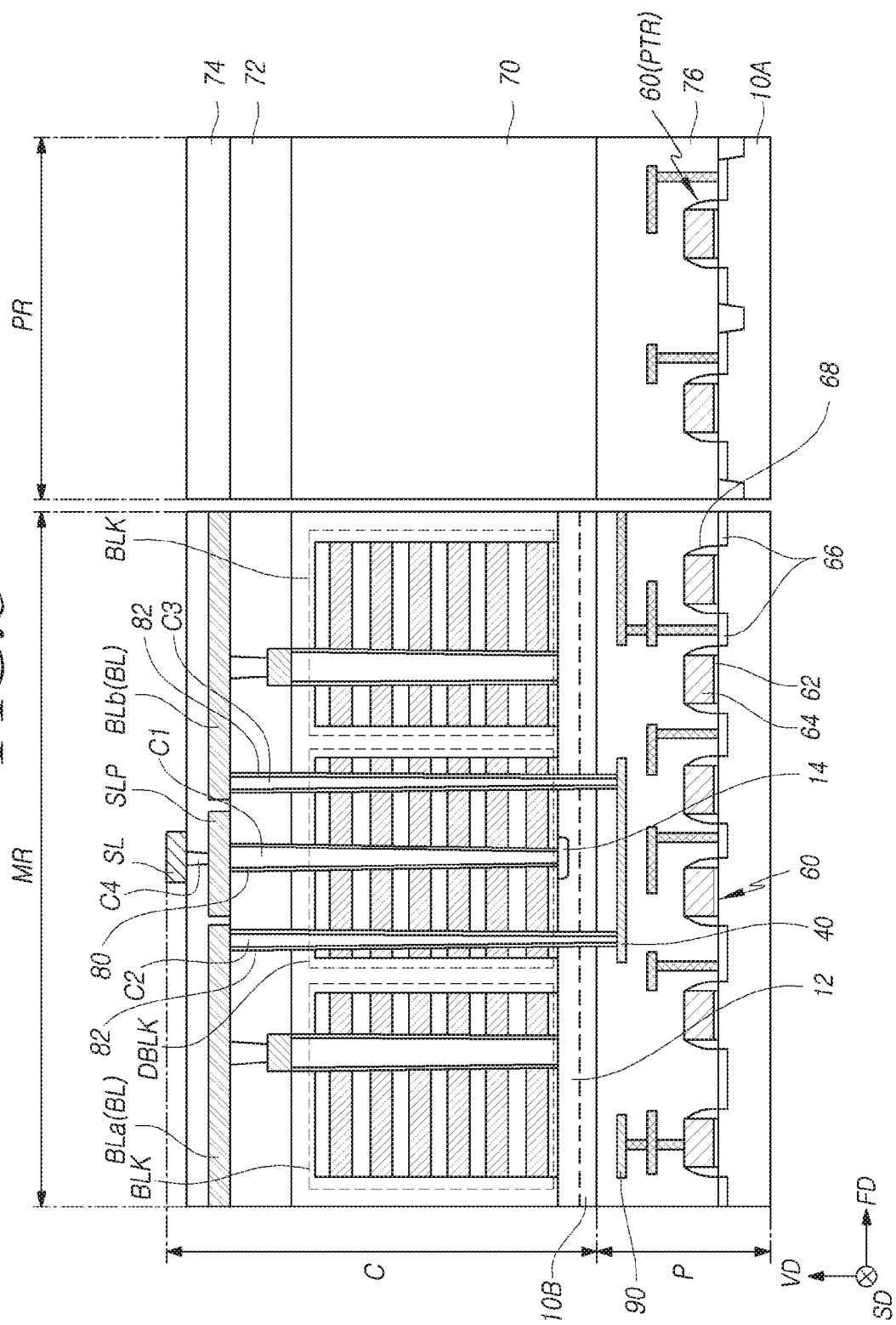
FIG. 8 is a cross-sectional view illustrating an example of a semiconductor memory device in accordance with an embodiment.

FIG. 8 is a cross-sectional view illustrating an example of a semiconductor memory device in accordance with an embodiment. While only one connecting line 40, one second contact C2 and one third contact C3 are shown on the cross section in FIG. 8, it is to be noted that a plurality of connection lines 40, a plurality of second contacts C2, and a plurality of third contacts C3 may be included.

Referring to FIG. 8, the connecting lines 40 may be disposed in the low insulating layer 76 of the peripheral circuit unit P. The connecting lines 40 may be disposed at the same layer as the low lines 90 in the low insulating layer 76.

One end of each of the connecting lines 40 may overlap with the first bit line section BLa of the corresponding bit line BL in the vertical direction VD, and the other end may overlap with the second bit line section BLb of the corresponding bit line BL in the vertical direction VD.

The second contacts C2 may be disposed in overlapping portions between the connecting lines 40 and the first bit line sections BLa, respectively. The second contacts C2 may pass through the second insulating layer 72, the first insulating layer 70, the dummy block DBLK, the second substrate 10B and the low insulating layer 76 in the vertical direction VD between the connecting lines 40 and the first bit line sections Bla, and electrically connect the connecting lines 40 and the first bit line sections BLa. The third contacts C3 may be disposed in overlapping portions between the connecting lines 40 and the second bit line sections BLb, respectively. The third contacts C3 may pass through the second insulating layer 72, the first insulating layer 70, the dummy block DBLK, the second substrate 10B and the low insulating layer 76 in the vertical direction VD between the connecting lines 40 and the second bit line sections BLb, and electrically connect the connecting lines 40 and the second bit line sections BLb.

A second sidewall insulating layer 82 may be disposed at an outer wall of the second contacts C2 and the third contacts C3. The second sidewall insulating layer 82 may have the shape of a straw or a cylinder shell which surrounds the outer wall of each of the second contacts C2 and the third contacts C3. The second contacts C2 and the third contacts C3 may be electrically isolated from the dummy gate electrode layers 30 of the dummy block DBLK and the second substrate 10B by the second sidewall insulating layer 82.

Figure 9:
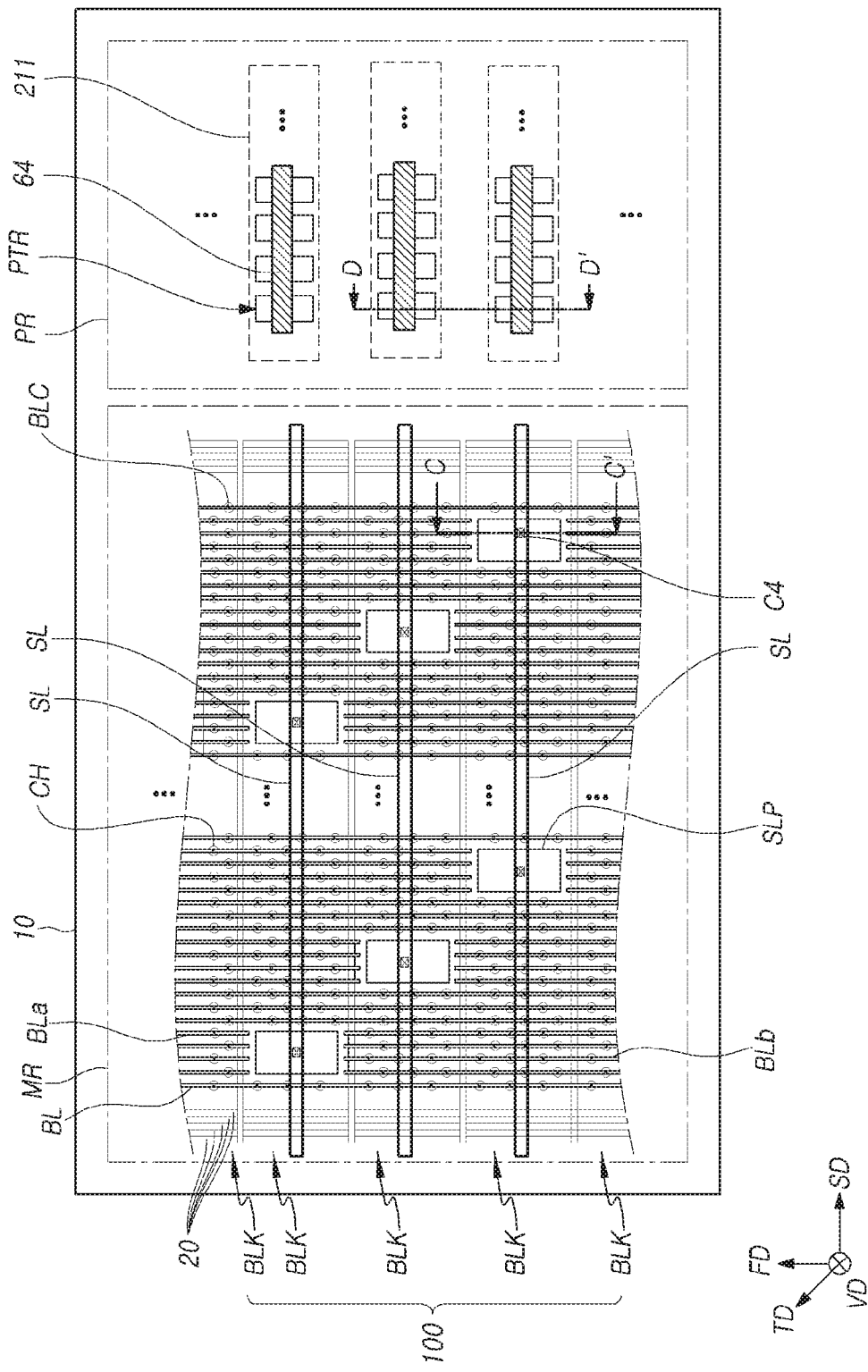
FIG. 9 is a top view schematically illustrating an example of a semiconductor memory device in accordance with an embodiment.
Figure 10:
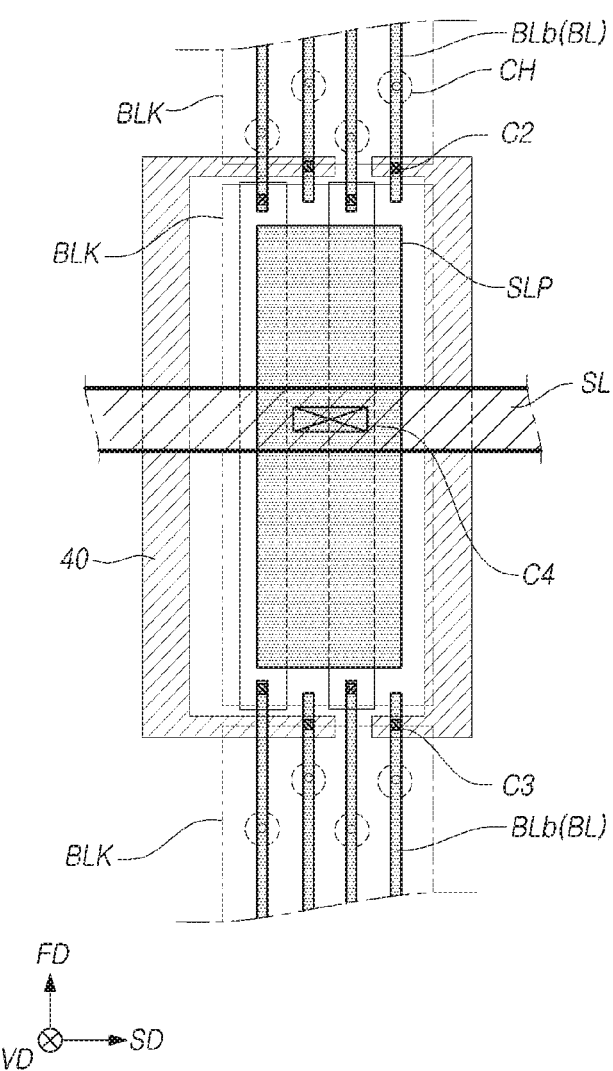
FIG. 10 is a top view illustrating an enlarged cutting portion of bit lines in FIG. 9.

FIG. 9 is a top view schematically illustrating an example of a semiconductor memory device in accordance with an embodiment. FIG. 10 is a top view enlarging a cutting portion of a bit line in FIG. 9.

Referring to FIGS. 9 and 10, a substrate 10 including a main region MR and a peripheral region PR may be provided. In FIG. 9, the connecting lines 40 in FIG. 10 and the contacts C2 and C3 in FIG. 10 connected thereto are omitted for the sake of simplification of the drawings.

The memory cell array 100 may be disposed in the main region MR of the substrate 10.

The memory cell array 100 may include the plurality of memory blocks BLK. In the embodiment, the memory cell array 100 may not include the dummy block DBLK as shown in FIGS. 3 and 4. The memory blocks BLK may be disposed along the first direction FD. Each of the memory blocks BLK may include the plurality of channel structures CH and the plurality of gate electrode layers 20.

The bit lines BL may be disposed on the memory blocks BLK. The bit lines BL may extend in the first direction FD and may be disposed along the second direction TD at a regular space interval.

One or more of the bit lines may be cut bit lines. While the embodiment describes the case where only some of the bit lines may be cut bit lines, the embodiment is not limited thereto. For example, in a variation of the embodiment all the bit lines BL may be cut bit lines.

Each of the cut bit lines BL may include a first bit line section BLa and a second bit line section BLb extending in opposite directions along the first direction FD when viewed from the cutting portion. The source line pads SLP may be disposed in spaces between the first bit line sections BLa and the second bit line sections BLb.

Two or more adjacent bit lines BL may be successively cut along the second direction SD. Each of the source line pads SLP may be disposed in a space between the first bit line shorts BLa and the second bit line shorts BLb of the successively cut bit lines BL.

Each of the source line pads SLP may overlap with one of the memory blocks BLK in the vertical direction VD. In the embodiment of FIG. 9. Although each of the source line pads SLP is shown overlapping with only one memory block, the invention is not limited thereto and each of the source line pads SLP may overlap with two or more memory blocks BLK.

The source line pads SLP may be formed to be centrally aligned along the axis of a third direction TD that is parallel to the top surface of the substrate 10 and intersects the first direction FD and the second direction SD. The cutting portion of the bit lines BL may vary depending on the position of the source line pads SLP.

Source lines SL may be disposed on the bit lines BL and the source line pads SLP. The source lines SL may extend in the second direction SD and may overlap with the source line pads SLP in the vertical direction VD.

The fourth contacts C4 may be disposed in overlapping portions between the source line SL and the source line pads SLP, respectively. The fourth contacts C4 may extend in the vertical direction VD between the source line pads SLP and the source line SL, and may electrically connect the source line SL and the source line pads SLP.

The connecting lines 40 corresponding to the cut bit lines BL may be disposed under the bit lines BL. One end of each of the connecting lines 40 may overlap with the first bit line section BLa of the corresponding bit line BL in the vertical direction VD, and the other end may overlap with the second bit line section BLb of the corresponding bit line BL in the vertical direction VD.

The second contacts C2 may be disposed in overlapping portions between the connecting lines 40 and the first bit line sections BLa, respectively. The second contacts C2 may extend in the vertical direction VD between the connecting lines 40 and the first bit line sections BLa, and electrically connect the connecting lines 40 and the first bit line sections BLa. The third contacts C3 may be disposed in overlapping portions between the connecting lines 40 and the second bit line sections BLb, respectively. The third contacts C3 may extend in the vertical direction VD between the connecting lines 40 and the second bit line sections BLb and electrically connect the connecting lines 40 and the second bit line sections BLb.

The plurality of pass transistor circuits 211 corresponding to each of the memory blocks BLK may be disposed in the peripheral region PR of the substrate 10. Each of the pass transistor circuits 211 may include the plurality of the pass transistors PTR.

Hereinbelow, the configuration of the semiconductor memory device in accordance with the embodiment of the invention will be described in more detail with reference to FIG. 11.

Figure 11:
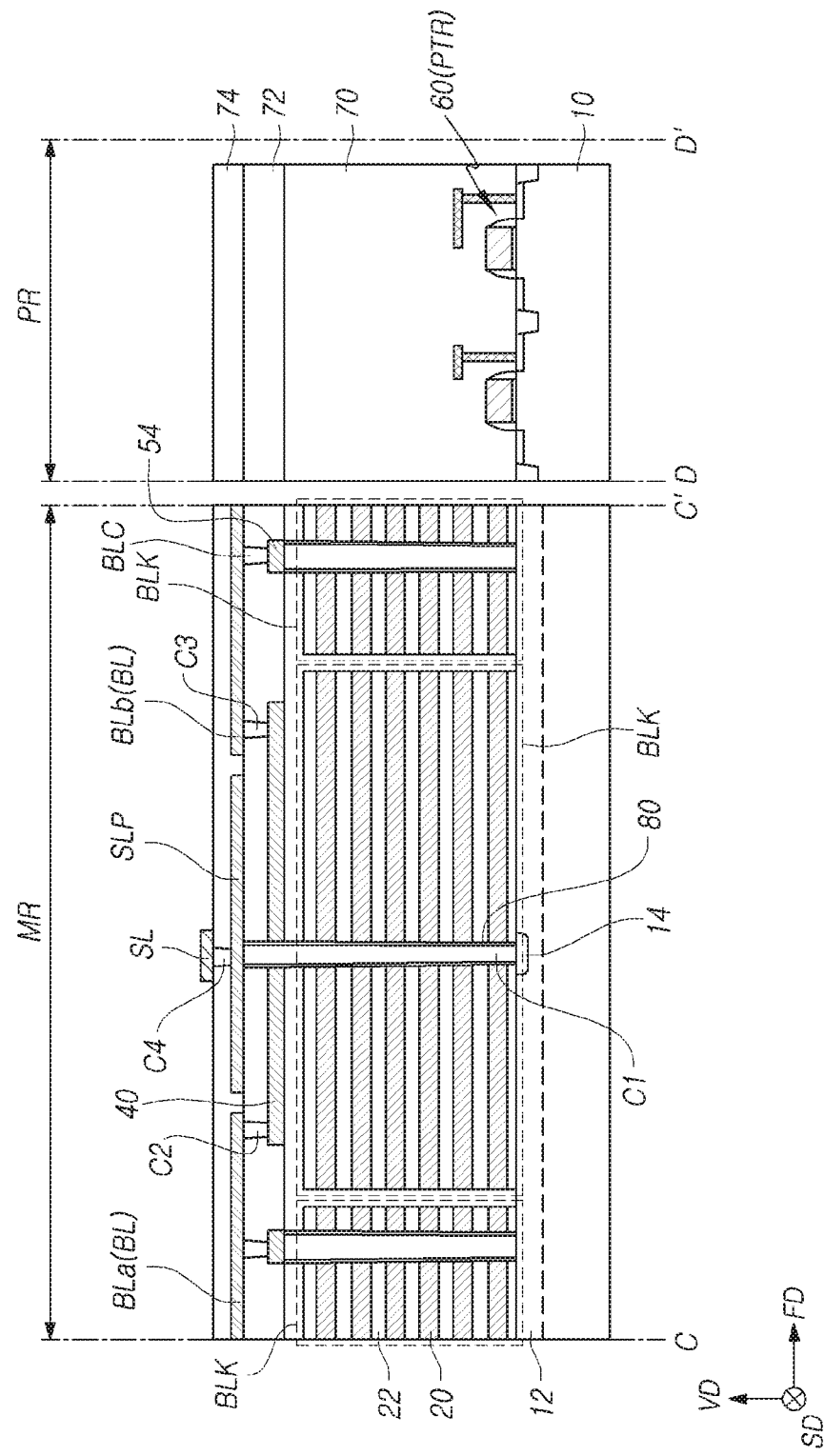
FIG. 11 is a cross-sectional view taken along the lines C-C' and D-D' of FIG. 9.

FIG. 11 is a cross-sectional view taken along the lines C-C' and D-D' of FIG. 9.

Referring to FIGS. 9 to 11, the well region 12 may be provided in the main region MR of the substrate 10. The well region 12 may be a P-type well doped with a P-type impurity. The well region 12 may be an N-type well. The well region 12 may be realized as a P-type well and an N-type well overlapping in the vertical direction VD.

The memory blocks BLK may be provided on the main region MR of the substrate 10.

Each of the memory blocks BLK may include the plurality of channel structures CH extending in the first direction FD from the top surface of the substrate 10, the plurality of gate electrode layers 20 and the plurality of first interlayer insulating layers 22. The plurality of gate electrode layers 20 and the plurality of first interlayer insulating layers 22 are alternately stacked on the substrate 10.

The pass transistor PTR may be disposed in the peripheral region PR of the substrate 10.

The first insulating layer 70 may be disposed on the substrate 10, and may cover the side surfaces and top surfaces of the gate electrode layers 20, the first interlayer insulating layers 22 and the pass transistor PTR.

The conductive pads 54 may be disposed on the channel structures CH, respectively. The second insulating layer 72 may be disposed on the first insulating layer 70 and cover the side surfaces and top surfaces of the conductive pads 54.

The bit lines BL may be disposed on the second insulating layer 72. The bit line contacts BLC which are connected to the conductive pads 54 through the second insulating layer 72 may be disposed under the bit lines BL. The bit lines BL may electrically connect to the channel layers 50 of the channel structures CH through the bit line contacts BLC and the conductive pads 54.

The bit lines BL may be cut in the predetermined area. Each of the cut bit lines BL may include the first bit line section BLa and the second bit line section BLb extending in opposite directions along the first direction FD when viewed from the cutting portions.

The source line pads SLP may be disposed on the second insulating layer 72 between the first bit line sections BLa and the second bit line sections BLb of the bit lines BL. The source line pads SLP may be disposed at the same layer as the bit lines BL in the space provided with cutting the bit lines BL.

Each of the source line pads SLP may overlap with one or more of the memory blocks BLK in the vertical direction VD. The channel structures CH may not be disposed in portions of the memory blocks BLK overlapping with the source line pads SLP. The channel structures CH may not overlap with the source line pads SLP in the vertical direction VD.

The first contact C1 may pass through the second insulating layer 72, the first insulating layer 70 and the memory block BLK under each of the source line pads SLP. The common source region 14 may be formed under the first contact C1 in the well region 12 of the substrate 10. The common source region 14 may electrically connect to the first contact C1.

The connecting lines 40 corresponding to the cut bit lines BL may be disposed on the first insulating layer 70. One end of each of the connecting lines 40 may overlap with the first bit line section BLa of the corresponding bit line BL in the vertical direction VD, and the other end may overlap with the second bit line section BLb of the corresponding bit line BL in the vertical direction VD.

The second contacts C2 may be disposed in overlapping portions between one ends of the connecting lines 40 and the first bit line sections BLa. The second contacts C2 may pass through the second insulating layer 72, and electrically connect the connecting lines 40 and the first bit line sections BLa. The third contacts C3 may be disposed in overlapping portions between the connecting lines 40 and the second bit line sections BLb, respectively. The third contacts C3 may pass through the second insulating layer 72, and electrically connect the connecting lines 40 and the second bit line sections BLb. Accordingly, the first bit line section BLa and the second bit line section BLb of each of the cut bit lines BL may electrically connect through the second contact C2, the connecting line 40 and the third contact C3.

The third insulating layer 74 may be disposed on the second insulating layer 72 and cover the side surfaces and top surfaces of the bit lines BL and the source line pad SLP. The source line SL may be disposed on the third insulating layer 74. The source line SL may overlap with the source line pads SLP in the vertical direction VD. The source line SL may electrically connect to the source line pads SLP through the fourth contacts C4 passing through the third insulating layer 74.

Each of the source line SL may electrically connect to the common source region 14 through the fourth contacts C4, the source line pads SLP and the first contacts C1, and transfer the source voltage to the common source region 14.

Figure 12:
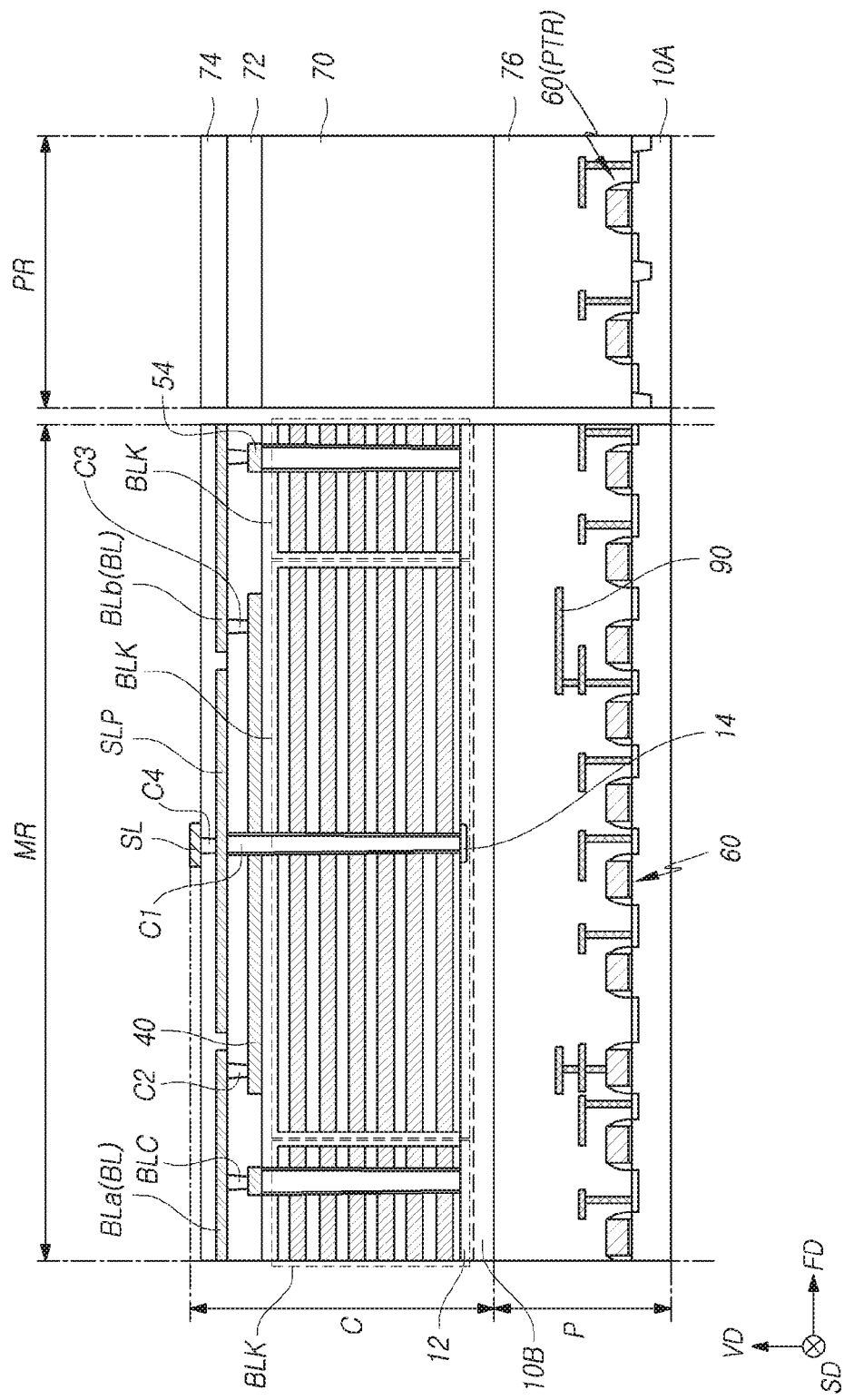
FIG. 12 is a cross-sectional view illustrating an example of a semiconductor memory device in accordance with an embodiment.

FIG. 12 is a cross-sectional view illustrating an example of a semiconductor memory device in accordance with an embodiment.

Referring to FIG. 12, the semiconductor memory device in accordance with the embodiment may have a PUC (peri under cell) structure. The cell unit C which includes the memory blocks BLK disposed on the peripheral circuit unit P which includes the peripheral circuit elements 60.

The peripheral circuit unit P may include the first substrate 10A and the cell unit C may include a second substrate 10B. The main region MR and the peripheral region PR may be defined in the semiconductor memory device or the first substrate 10A. The second substrate 10B is disposed on the main region MR.

The peripheral circuit unit P may include the first substrate 10A, the peripheral circuit elements 60, the low insulating layer 76 and the low line 90. The peripheral circuit elements 60 may construct the peripheral circuit 200 of FIG. 1.

The pass transistors PTR which of the row decoder (see 210 of FIG. 1) among the peripheral circuit 200 may be disposed on the peripheral region PR of the first substrate 10A.

The lower insulating layer 76 may be disposed on the first substrate 10A, and may cover the peripheral circuit elements 60. The lower line 90 may be disposed in the lower insulating layer 76 and may electrically connect to one or more peripheral circuit elements 60.

The cell unit C may be disposed on the lower insulating layer 76. The cell unit C may include the second substrate 10B, the memory blocks BLK, the connecting lines 40, the bit lines BL, the source line pads SLP, the source line SL and the first to the third insulating layer 70, 72 and 74.

The second substrate 10B may be disposed on the top surface of the lower insulating layer 76 of the main region MR. The well region 12 may be provided in the second substrate 10B. The common source region 14 may be formed in the well region 12 of the second substrate 10B.

The remaining components included in the cell unit C except for the second substrate 10B are substantially the same as those described with reference to FIG. 11, so repeated description of the same components will be omitted.

Figure 13:
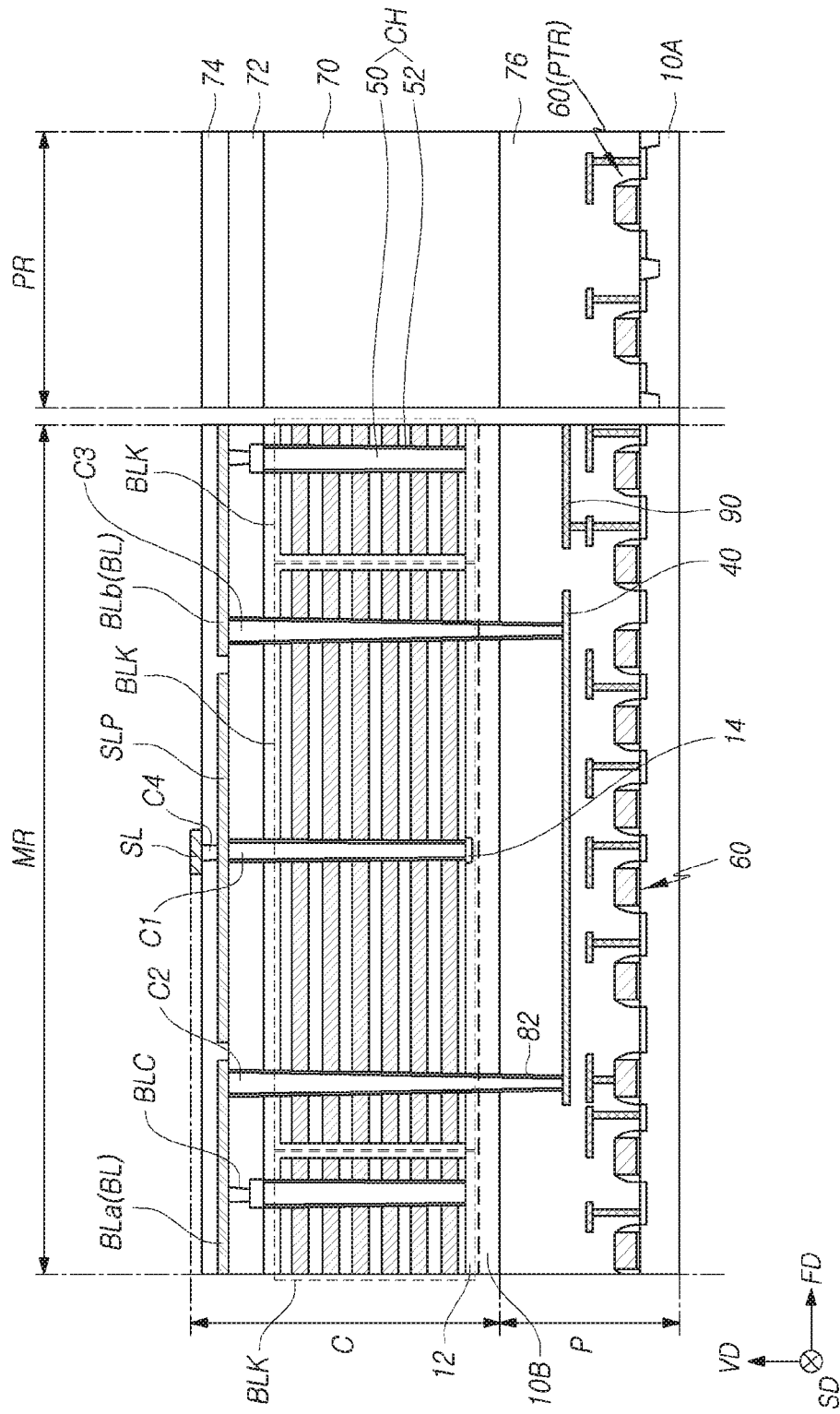
FIG. 13 is a cross-sectional view illustrating an example of a semiconductor memory device in accordance with an embodiment.

FIG. 13 is a cross-sectional view illustrating an example of a semiconductor memory device in accordance with an embodiment. While only one connecting line 40, one second contact C2 and one third contact C3 are shown on the cross section in FIG. 13, it is to be noted that a plurality of connection lines 40, a plurality of second contacts C2, and a plurality of third contacts C3 may be included in the embodiment.

Referring to FIG. 13, the connecting lines 40 may be disposed in the low insulating layer 76 of the peripheral circuit unit P. The connecting lines 40 may be disposed at the same layer as the low lines 90 in the low insulating layer 76.

One end of each of the connecting lines 40 may overlap with the first bit line section BLa of the corresponding bit line BL in the vertical direction VD, and the other end may overlap with the second bit line section BLb of the corresponding bit line BL in the vertical direction VD.

The second contacts C2 may be disposed in overlapping portions between the connecting lines 40 and the first bit line sections BLa. The second contacts C2 may pass through the second insulating layer 72, the first insulating layer 70, the memory block BLK, the second substrate 10B and the low insulating layer 76 in the vertical direction VD between the connecting lines 40 and the first bit line sections Bla, and electrically connect the connecting lines 40 and the first bit line sections BLa. The third contacts C3 may be disposed in overlapping portions between the connecting lines 40 and the second bit line sections BLb. The third contacts C3 may pass through the second insulating layer 72, the first insulating layer 70, the memory block BLK, the second substrate 10B and the low insulating layer 76 in the vertical direction VD between the connecting lines 40 and the second bit line sections BLb, and electrically connect the connecting lines 40 and the second bit line sections BLb.

The second sidewall insulating layer 82 may be disposed at an outer wall of the second contacts C2 and the third contacts C3. The second sidewall insulating layer 82 may have the shape of a straw or a cylinder shell which surrounds the outer wall of each of the second contacts C2 and the third contacts C3. The second contacts C2 and the third contacts C3 may be electrically isolated from the gate electrode layers 20 of the memory block BLK and the second substrate 10B by the second sidewall insulating layer 82.

Figure 14:
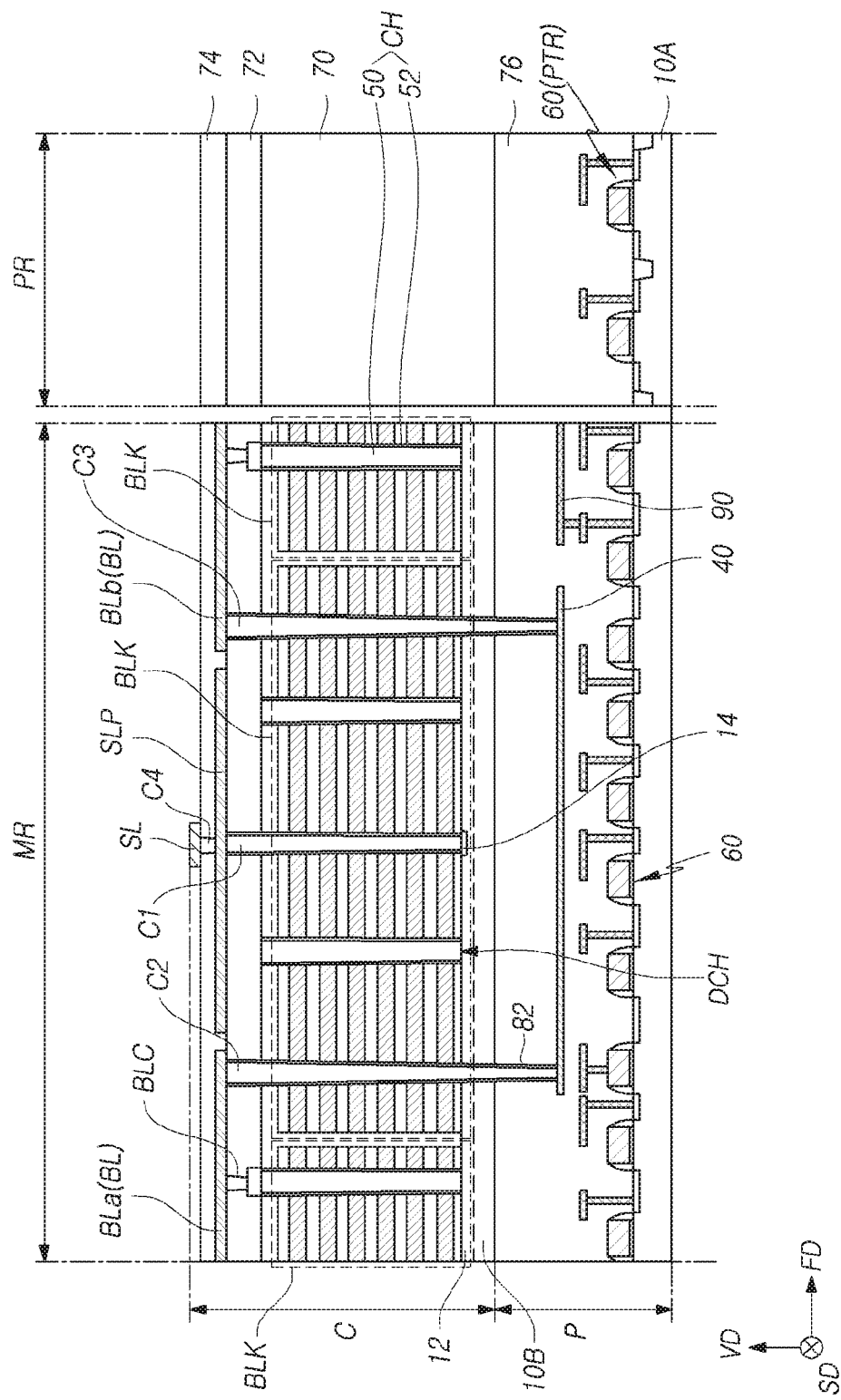
FIG. 14 is a cross-sectional view illustrating an example of a semiconductor memory device in accordance with an embodiment.

FIG. 14 is a cross-sectional view illustrating an example of a semiconductor memory device in accordance with an embodiment. While only one connecting line 40, one second contact C2, one third contact C3 and the source line pad SLP are shown on the cross section in FIG. 14, it is to be noted that a plurality of connection lines 40, a plurality of second contacts C2, a plurality of third contacts C3, and a plurality of source line pad SLP may be included in the embodiment.

Referring to FIG. 14, the connecting lines 40 may be disposed in the low insulating layer 76 of the peripheral circuit unit P. The connecting lines 40 may be disposed at the same layer as the low lines 90 in the low insulating layer 76.

Each of the source line pads SLP may overlap with one or more of the memory blocks BLK. The channel structures CH may not be disposed in portions of the memory blocks BLK overlapping with the source line pads SLP. The channel structures CH may not overlap with the source line pads SLP in the vertical direction VD.

The dummy channel structures DCH may be disposed in portions of the memory blocks BLK overlapping with the source line pads SLP. The dummy channel structures DCH may have the same pitch as the channel structures CH. The dummy channel structures DCH may be formed at the same processing step as the channel structures CH. The dummy channel structures DCH may have the same structure as the channel structures CH.

Since the dummy channel structures DCH are additionally formed in the portions of the memory blocks BLK overlapping with the source line pads SLP, the pattern density can be uniformly maintained in the process for forming the channel structures CH. Therefore, it is possible to prevent a process error because of non-uniformity of the pattern density.

Figure 15:
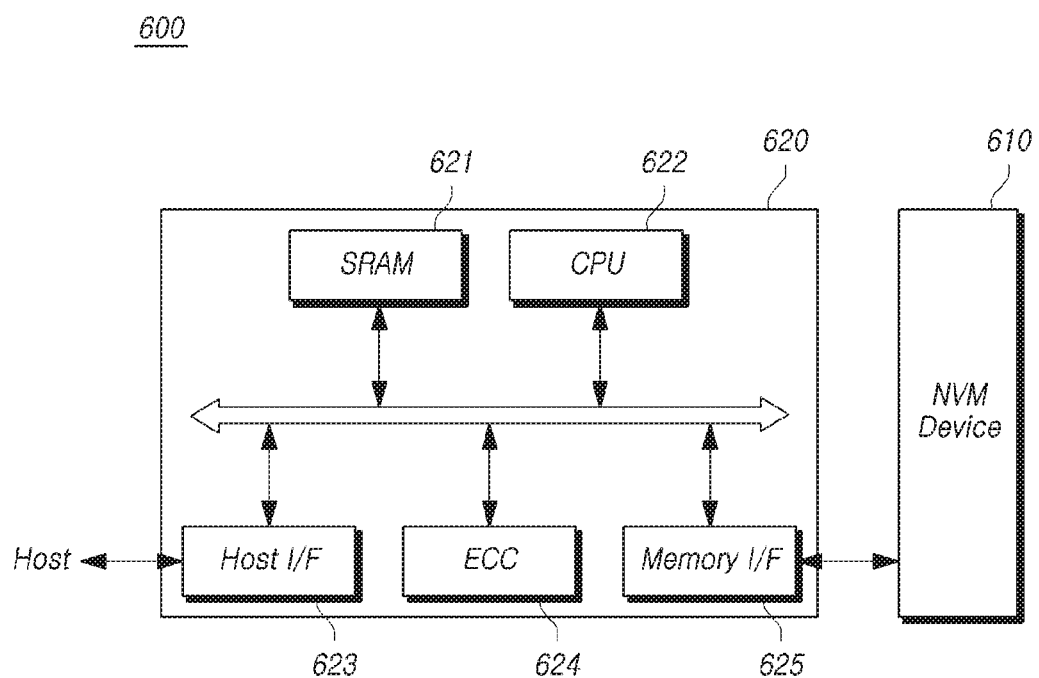
FIG. 15 is a simplified block diagram schematically illustrating a memory system including a semiconductor memory device in accordance with an embodiment.

FIG. 15 is a simplified block diagram schematically illustrating a memory system including a memory device in accordance with an embodiment of the invention.

Referring to FIG. 15, the memory system 600 may include the semiconductor memory device 610 and a memory controller 620.

The semiconductor memory device 610 may comprise the memory device in accordance with an embodiment of the invention as described above, and may be operated in the manner described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an ECC block 624, and a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may serve as a storage medium of high reliability having a low probability of an error occurring. The aforementioned nonvolatile memory device may be provided for a memory system such as a solid-state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 16:
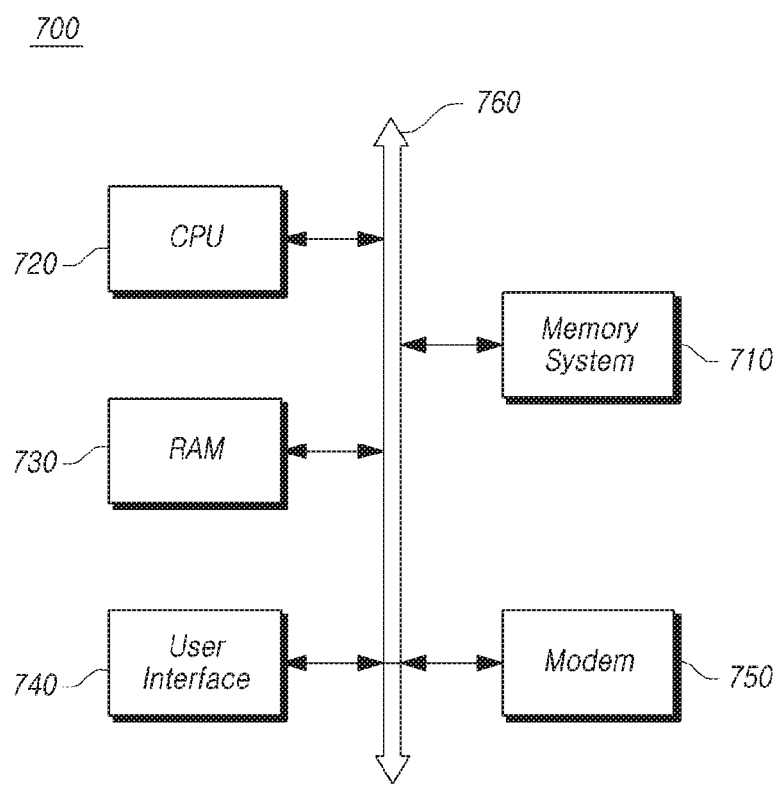
FIG. 16 is a simplified block diagram schematically illustrating a computing system including a semiconductor memory device in accordance with an embodiment.

FIG. 16 is a simplified block diagram schematically illustrating a computing system including a memory device, in accordance with an embodiment of the invention.

Referring to FIG. 16, a computing system 700 according to an embodiment may include a memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also, as an example, the memory system 710 may be configured as a fusion flash memory, for example, a NAND, or a NOR flash memory.

It is noted that the above-described embodiments may be realized not only by a device and a method, but may be realized also by a program which performs the function or functions corresponding to the configuration of each embodiment or a recording medium on which the program is recorded. Such realization may be readily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
    a memory cell array disposed on a substrate;
    a plurality of bit lines disposed on the memory cell array, each bit line extending in a first direction parallel to the top surface of the substrate and divided into a first bit line section and a second bit line section; and
    a plurality of source line pads disposed at the same layer as the bit lines between the first bit line sections of the bit lines and the second bit line sections of the bit lines,
    wherein the memory cell array comprises:
    a plurality of memory blocks, each of which comprises channel structures extending from a top surface of the substrate in a vertical direction perpendicular to the top surface of the substrate and electrically connected to the bit lines, a plurality of gate electrode layers and a plurality of first interlayer insulating layers alternately stacked over the substrate to be adjacent to the channel structures.

2. The semiconductor memory device according to claim 1,
wherein the source line pads connect to the substrate through respective first contacts passing through the memory cell array.

3. The semiconductor memory device according to claim 2, further comprising:
a sidewall insulating layer disposed at an outer wall of each of the first contacts and electrically isolating the first contacts and the memory cell region;
a first insulating layer disposed on the substrate and covering the memory cell array;
a second insulating layer disposed on the first insulating layer and supporting the bit lines and the source line pads; and
a plurality of connecting lines disposed on the first insulating layer, one end of each of which is connected to the first bit line section of a corresponding bit line through a second contact and the other end of each of which is connected to the second bit line section of the corresponding bit line through a third contact.

4. The semiconductor memory device according to claim 3, wherein the memory cell array further comprises:
a dummy block comprising a plurality of dummy gate electrode layers and a plurality of second interlayer insulating layers alternately stacked over the substrate.

5. The semiconductor memory device according to claim 4, wherein the source line pads overlap with the dummy block in the vertical direction, and the first contacts pass through the dummy block.

6. The semiconductor memory device according to claim 5, wherein the dummy block extends in a second direction that is parallel to the top surface of the substrate and intersecting the first direction, and the source line pads are disposed along the second direction.

7. The semiconductor memory device according to claim 1, wherein each of the source line pads overlaps with at least one of the memory blocks in the vertical direction, and the first contacts pass through the at least one of the memory blocks.

8. The semiconductor memory device according to claim 1, wherein the memory blocks extend in a second direction that is parallel to the top surface of the substrate and intersecting the first direction, and
the source line pads are disposed along a third direction that is parallel to the top surface of the substrate and intersecting the first and the second directions.

9. A semiconductor memory device comprising:
a peripheral circuit unit comprising a first substrate, a peripheral circuit element disposed on the first substrate, and a bottom insulating layer disposed on the first substrate and covering the peripheral circuit element; and
a cell unit disposed on the peripheral circuit unit,
wherein the cell unit comprises:
a second substrate disposed on the bottom insulating layer;
a memory cell array disposed on the second substrate;
a plurality of bit lines disposed on the memory cell array and extended in a first direction parallel to the top surface of the substrate, each divided into a first bit line section and a second bit line section; and
a source line pads disposed at the same layer as the bit lines between the first bit line sections of the bit lines and the second bit line sections of the bit lines, and connected to the substrate through first contacts passing through the memory cell array,
wherein the memory cell array comprises:
a plurality of memory blocks, each memory block comprising channel structures extending from a top surface of the substrate in a vertical direction perpendicular to the top surface of the substrate and electrically connected to the bit lines, a plurality of gate electrode layers and a plurality of first interlayer insulating layers alternately stacked over the substrate to be adjacent to the channel structures.

10. The semiconductor memory device according to claim 9, further comprising:
a first insulating layer disposed on the substrate and covering the memory cell array; and
a second insulating layer disposed on the first insulating layer and supporting the bit lines and the source line pads.

11. The semiconductor memory device according to claim 10, further comprising:
connecting lines disposed on the first insulating layer, one end of each of which is connected to the first bit line section of a corresponding bit line through a second contact which passes through the second insulating layer and the other end of each of which is connected to the second bit line section of the corresponding bit line through a third contact which passes through the second insulating layer.

12. The semiconductor memory device according to claim 9, further comprising:
connecting lines disposed in the bottom insulating layer, one end of each connecting line connected to the first bit line section of a corresponding bit line through a second contact passing through the memory cell array and the second substrate, and the other end of connecting line connected to the second bit line section of the corresponding bit line through a third contact passing through the memory cell array and the second substrate.

13. The semiconductor memory device according to claim 9, wherein the memory cell array further comprises:
a dummy block comprising a plurality of dummy gate electrode layers and a plurality of second interlayer insulating layers alternately stacked over the substrate.

14. The semiconductor memory device according to claim 13, wherein the source line pads overlap with the dummy block in the vertical direction, and the first contacts pass through the dummy block.

15. The semiconductor memory device according to claim 9, wherein the channel structures do not overlap with the source line pads in the vertical direction.

16. The semiconductor memory device according to claim 15, wherein each of the memory blocks further comprises dummy structures passing through the gate electrode layers and the first interlayer insulating layer at a position overlapping with the source line pads in the vertical direction and is not connected to the bit lines.

17. The semiconductor memory device according to claim 16, wherein the dummy structures are disposed with the same pitch as the channel structures.

18. A semiconductor memory device comprising:
a memory cell array disposed on a substrate;
a plurality of bit lines disposed on the memory cell array, each bit line extending in a first direction parallel to the top surface of the substrate,
wherein a plurality of cut areas are formed spaced apart at a regular interval, each cut is formed with at least two adjacent bit lines and each bit line cut into a first bit line section and a second bit line section; and a plurality of source line pads disposed in respective cut areas at the same layer as the bit lines between the first bit line sections and the second bit line sections of the cut bit lines,
wherein the memory cell array comprises:
a plurality of memory blocks, each of which comprises channel structures extending from a top surface of the substrate in a vertical direction perpendicular to the top surface of the substrate and electrically connected to the bit lines, a plurality of gate electrode layers and a plurality of first interlayer insulating layers alternately stacked over the substrate to be adjacent to the channel structures.

* * * * *